US012648317B2

(12) United States Patent
Jo et al.

(10) Patent No.: US 12,648,317 B2
(45) Date of Patent: Jun. 2, 2026

(54) DISPLAY PANEL

(71) Applicant: Samsung Display Co., Ltd., Yongin-si (KR)

(72) Inventors: Kangmoon Jo, Hwaseong-si (KR); Unbyoll Ko, Hwaseong-si (KR); Sunkwang Kim, Seoul (KR); So-Woon Kim, Suwon-si (KR); Ansu Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 558 days.

(21) Appl. No.: 18/047,955

(22) Filed: Oct. 19, 2022

(65) Prior Publication Data

US 2023/0121371 A1 Apr. 20, 2023

(30) Foreign Application Priority Data

Oct. 20, 2021 (KR) ........................ 10-2021-0140000

(51) Int. Cl.
H10K 59/131 (2023.01)
H10D 86/40 (2025.01)
(Continued)

(52) U.S. Cl.
CPC ....... H10K 59/1315 (2023.02); H10D 86/441 (2025.01); H10D 86/60 (2025.01); H10K 59/1213 (2023.02); H10K 59/1216 (2023.02)

(58) Field of Classification Search
CPC .......... H10K 59/1315; H10K 59/1213; H10K 59/1216; H10K 59/126; H10K 59/38;
(Continued)

(56) References Cited

U.S. PATENT DOCUMENTS 10,217,802 B2 2/2019 Hwang
10,297,194 B2 5/2019 Kim
(Continued)

FOREIGN PATENT DOCUMENTS

KR 10-1740192 B1 5/2017
KR 10-2017-0079541 A 7/2017
(Continued)

*Primary Examiner* — Chad M Dicke
*Assistant Examiner* — Gary Abel
(74) *Attorney, Agent, or Firm* — Womble Bond Dickinson (US) LLP

(57) ABSTRACT

A display panel includes: a first pixel connected to a reference line, a scan line, a sensing line, a first power line, a first data line, and a second power line. The first pixel includes a first transistor, a second transistor, a third transistor, a light-emitting element, and a capacitor. The light-emitting element includes a first electrode, a second electrode, and a light-emitting layer between the first electrode and the second electrode. The second power line includes a first line and a second line overlapping with the first line, the first line being located on an insulating layer on which the first data line is located, and the second line being located on an insulating layer different from the insulating layer on which the first line is located. The first line is spaced from the first data line, and the second line overlaps with the first data line.

18 Claims, 18 Drawing Sheets

(51) Int. Cl.
    *H10D 86/60* (2025.01)
    *H10K 59/121* (2023.01)
(58) Field of Classification Search
    CPC .. H10K 59/131; H10K 50/166; H10K 59/123;
        H10K 59/12; H10K 59/10; H10K 59/82;
        H10D 86/441; H10D 86/60; H10D
        86/481; H10D 86/443
    See application file for complete search history.

(56) References Cited

U.S. PATENT DOCUMENTS

| | | | |
|---|---|---|---|
| 10,679,567 B2* | 6/2020 | Lee | H10K 59/805 |
| 10,811,438 B2 | 10/2020 | Choi | |
| 10,825,885 B2 | 11/2020 | Moon et al. | |
| 10,943,970 B2 | 3/2021 | Jo et al. | |
| 10,985,218 B2 | 4/2021 | Park et al. | |
| 12,066,725 B2 | 8/2024 | Lee et al. | |

| | | | |
|---|---|---|---|
| 2020/0105849 A1* | 4/2020 | Kim | H10K 59/1213 |
| 2020/0119115 A1 | 4/2020 | Moon et al. | |
| 2020/0302840 A1* | 9/2020 | Kim | G09G 3/006 |
| 2021/0202661 A1* | 7/2021 | Kim | H10K 59/124 |
| 2021/0202662 A1* | 7/2021 | Jo | H10K 59/131 |
| 2022/0208886 A1* | 6/2022 | Kim | H10K 59/353 |
| 2022/0319438 A1* | 10/2022 | Sun | H10D 86/481 |
| 2025/0063912 A1* | 2/2025 | Zheng | G09G 3/3266 |

FOREIGN PATENT DOCUMENTS

| | | | |
|---|---|---|---|
| KR | 10-2018-0024910 A | 3/2018 | |
| KR | 10-2019-0063230 A | 6/2019 | |
| KR | 10-2020-0037027 A | 4/2020 | |
| KR | 10-2020-0039904 A | 4/2020 | |
| KR | 10-2020-0040965 A | 4/2020 | |
| KR | 10-2020-0040967 A | 4/2020 | |
| KR | 10-2020-0088923 A | 7/2020 | |
| KR | 10-2021-0050611 A | 5/2021 | |

* cited by examiner

PX: PX11, ..., PXnm

DISPLAY PANEL

CROSS-REFERENCE TO RELATED APPLICATIONS

This application claims priority to and the benefit of Korean Patent Application No. 10-2021-0140000, filed on Oct. 20, 2021, the entire content of which is incorporated by reference herein.

BACKGROUND

Aspects of embodiments of the present disclosure relate to a display panel, and more particularly, to a display panel including a circuit element having improved reliability.

A display panel includes a plurality of pixels, and a driving circuit (e.g., a scan driving circuit and a data driving circuit) to control the plurality of pixels. Each of the plurality of pixels includes a display element, and a pixel driving circuit to control the display element. The pixel driving circuit may include a plurality of organically connected transistors.

The driving circuit (e.g., the scan driving circuit and/or the data driving circuit) may be formed through the same process as a process in which the plurality of pixels are formed. The driving circuit (e.g., the scan driving circuit and/or the data driving circuit) may include a plurality of organically connected transistors.

The above information disclosed in this Background section is for enhancement of understanding of the background of the present disclosure, and therefore, it may contain information that does not constitute prior art.

SUMMARY

One or more embodiments of the present disclosure are directed to a display panel having improved display quality.

According to one or more embodiments of the present disclosure, a display panel includes: a base layer; a plurality of insulating layers on the base layer; and a first pixel connected to a reference line, a scan line, a sensing line, a first power line, a first data line, and a second power line. The reference line is configured to provide an initialization voltage; the scan line and the sensing line each extend in a first direction, and are spaced from each other in a second direction crossing the first direction; the first power line is configured to provide a first voltage; the first data line extends in the second direction; and the second power line extends in the second direction, and is configured to provide a second voltage lower than the first voltage. The first pixel includes a first transistor, a second transistor, a third transistor, a light-emitting element, and a capacitor; and the light-emitting element includes a first electrode connected to at least one of the first, second, or third transistors, a second electrode, and a light-emitting layer between the first electrode and the second electrode. The second power line includes a first line and a second line overlapping with the first line, the first line being located on an insulating layer on which the first data line is located, and the second line being located on an insulating layer different from the insulating layer on which the first line is located. The first line is spaced from the first data line; and the second line overlaps with the first data line.

In an embodiment, an area of the second line may be larger than an area of the first line.

In an embodiment, the second power line may further include an additional line between the first line and the second line, the additional line extending in the second direction; end portions of the additional line that are spaced from each other in the second direction may overlap with the first data line; and a remaining portion of the additional line may be spaced from the first data line in the first direction.

In an embodiment, the display panel may further include: a second data line spaced from the first data line in the first direction, and extending in the second direction; and a second pixel spaced from the first pixel, and connected to the reference line, the scan line, the sensing line, the second data line, the first power line, and the second power line. The second data line may overlap with the second line, and may be spaced from the first line in the first direction with the first data line interposed therebetween.

In an embodiment, the display panel may further include: a third data line spaced from the second data line in the first direction with the first data line interposed therebetween, and extending in the second direction; and a third pixel spaced from the second pixel, and connected to the reference line, the scan line, the sensing line, the third data line, the first power line, and the second power line. The third data line may overlap with the second line, and may be located between the first data line and the first line.

In an embodiment, the first transistor may include a drain connected to the first electrode, a source, a channel region, and a gate; the second transistor may include a source connected to the gate of the first transistor, a drain connected to the first data line, a channel region, and a gate connected to the scan line; and the third transistor may include a drain connected to the second electrode, a source connected to the reference line, a channel region, and a gate connected to the sensing line.

In an embodiment, the insulating layers may include: a first insulating layer on the base layer to cover a first conductive layer; a second insulating layer on the first insulating layer to cover a second conductive layer; a third insulating layer on the second insulating layer to cover a third conductive layer; and a fourth insulating layer on the third insulating layer to cover a fourth conductive layer. The first conductive layer may include the reference line, the first power line, the first data line, the first line, and a light blocking pattern located below the first transistor.

In an embodiment, the second conductive layer may include the source, the drain, and the channel region of each of the first, second, and third transistors.

In an embodiment, first power contact holes and a first line contact hole exposing a portion of the first power line may be defined in the first insulating layer; first additional contact holes exposing a portion of the first line, first reference contact holes exposing a portion of the reference line, and a data contact hole exposing a portion of the first data line may be defined in the first insulating layer; semi-conductor contact holes exposing a portion of the source and a portion of the drain of each of the first to third transistors may be defined in the second insulating layer; and a first light blocking contact hole exposing a portion of the light blocking pattern adjacent to the source of the first transistor may be defined in the first insulating layer and the second insulating layer.

In an embodiment, the third conductive layer may include: a portion of each of the scan line, the sensing line, and the capacitor; a first additional reference line overlapping with the reference line, and connected to the source of the third transistor; a first bridge pattern connecting the drain of the third transistor and the source of the first transistor to each other; the gate of the first transistor; a first additional power line overlapping with a portion of the first power line, and connected to the drain of the first transistor; and a second bridge pattern connecting the source of the second transistor and the first data line to each other.

In an embodiment, the second power line may further include an additional line located between the first line and the second line, and extending in the second direction; and the additional line may be included in the third conductive layer.

In an embodiment, second reference contact holes exposing a portion of the first additional reference line may be defined in the third insulating layer; scan contact holes exposing a portion of the scan line and the sensing line may be defined in the third insulating layer; a source contact hole overlapping with the source of the first transistor and exposing the first bridge pattern may be defined in the third insulating layer; second power contact holes overlapping with the first additional power line, a second line contact hole overlapping with the first line contact hole, and a second light blocking contact hole overlapping with the first light blocking contact hole may be defined in the third insulating layer; and second additional contact holes exposing a portion of the additional line may be defined in the third insulating layer.

In an embodiment, the second insulating layer may be covered by the third conductive layer.

In an embodiment, the fourth conductive layer may be on the third insulating layer, and may include: a remaining portion of each of the scan line, the sensing line, and the capacitor; a second additional reference line overlapping with the first reference line; a second additional power line overlapping with a portion of the first additional power line; a connection pattern overlapping with the light blocking pattern, and connecting the first bridge pattern and the first electrode to each other; and the second line.

In an embodiment, a connection contact hole may be defined in the fourth insulating layer; and the first electrode may be connected to the first bridge pattern through the connection contact hole to be connected to the first transistor.

According to one or more embodiments of the present disclosure, a display panel includes: a scan line partially extending in a first direction; a data line extending in a second direction crossing the first direction; a light-emitting element including a first electrode, a second electrode on the first electrode, and at least one light-emitting layer between the first electrode and the second electrode; a first transistor connected to the first electrode; a second transistor connected to the data line; a first power line configured to provide a first voltage to the first transistor; and a second power line configured to provide a second voltage lower than the first voltage to the second electrode. The second power line includes a first line located at the same layer as that of the data line, and a second line located at a different layer from that of the first line; and the area of the second line is larger than the area of the first line.

In an embodiment, the second line may overlap with the first line and the data line.

In an embodiment, the first transistor may include a source connected to the light-emitting element, a drain connected to the first power line, a channel region, and a gate; the second transistor may include a source connected to the first transistor, a drain connected to the data line, a channel region, and a gate connected to the scan line; and the display panel may further include a bridge pattern connecting the source of the second transistor and the data line to each other, the bridge pattern being located at the same layer as that of the gates of the first and second transistors.

In an embodiment, at least a portion of the bridge pattern may overlap with the second line.

In an embodiment, the light-emitting element may include: a plurality of light-emitting units; and charge generation layers located between the light-emitting units; and each of the light-emitting units may include the light-emitting layer, a hole control layer between the first electrode and the light-emitting layer, and a charge control layer between the light-emitting layer and the second electrode.

BRIEF DESCRIPTION OF THE FIGURES

The above and other aspects and features of the present disclosure will be more clearly understood from the following detailed description of the illustrative, non-limiting embodiments with reference to the accompanying drawings. In the drawings.

DETAILED DESCRIPTION

Figure 1A:
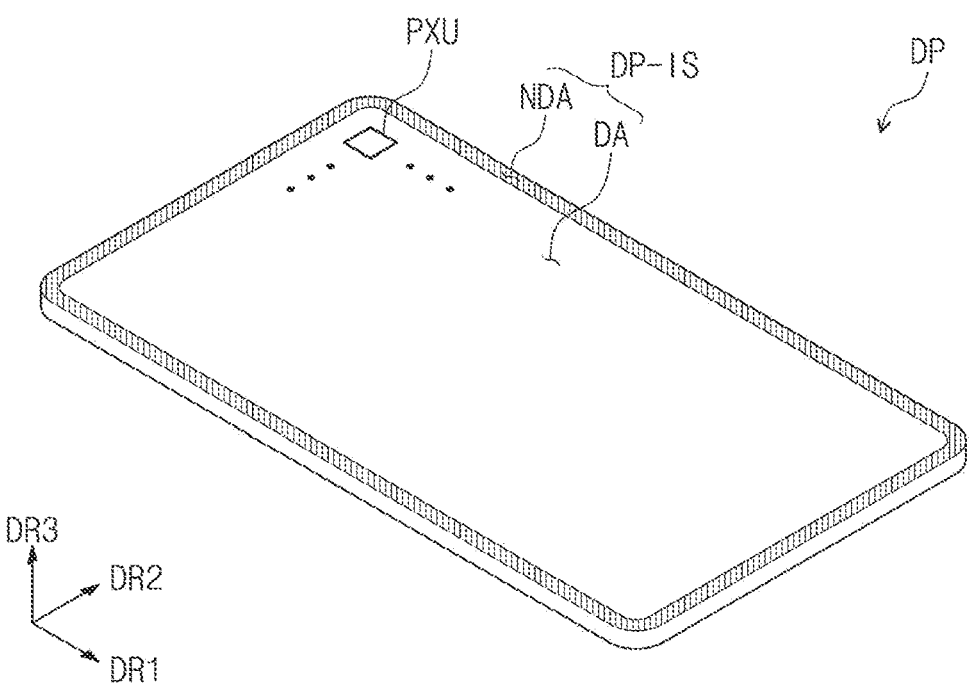
FIG. 1A is a perspective view of a display panel according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative thicknesses, sizes, ratios, and dimensions of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) based on the directions as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
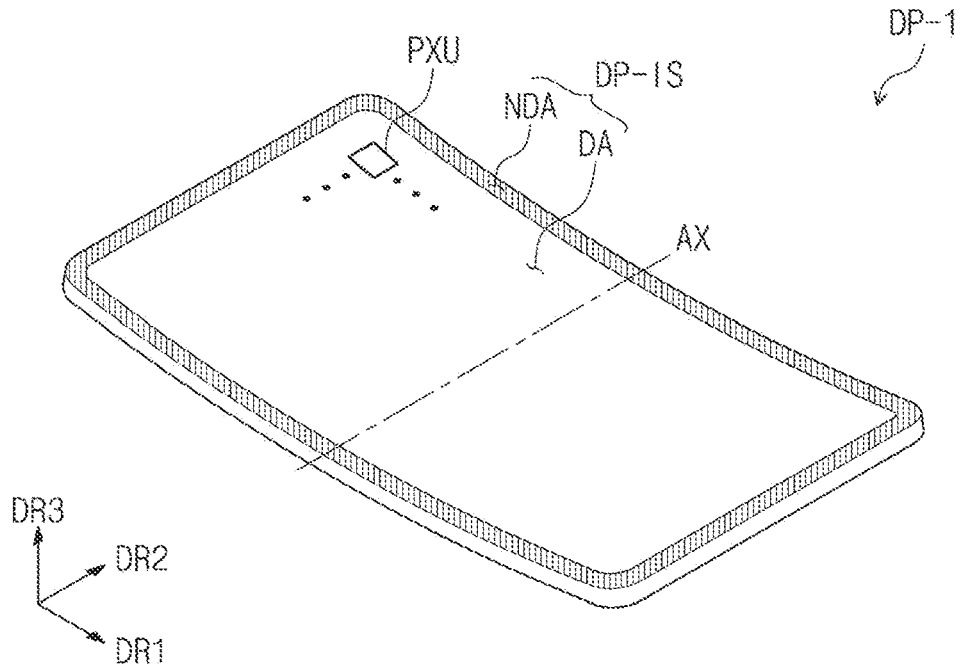
FIG. 1B is a perspective view of a curved display panel according to an embodiment of the present disclosure.
Figure 2:
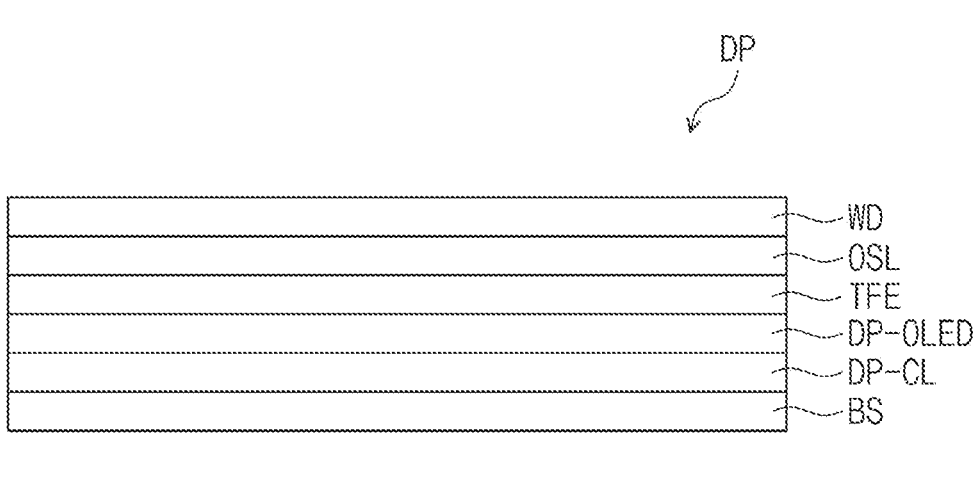
FIG. 2 is a cross-sectional view of the display panel according to an embodiment of the present disclosure.
Figure 2:
Figure 3:
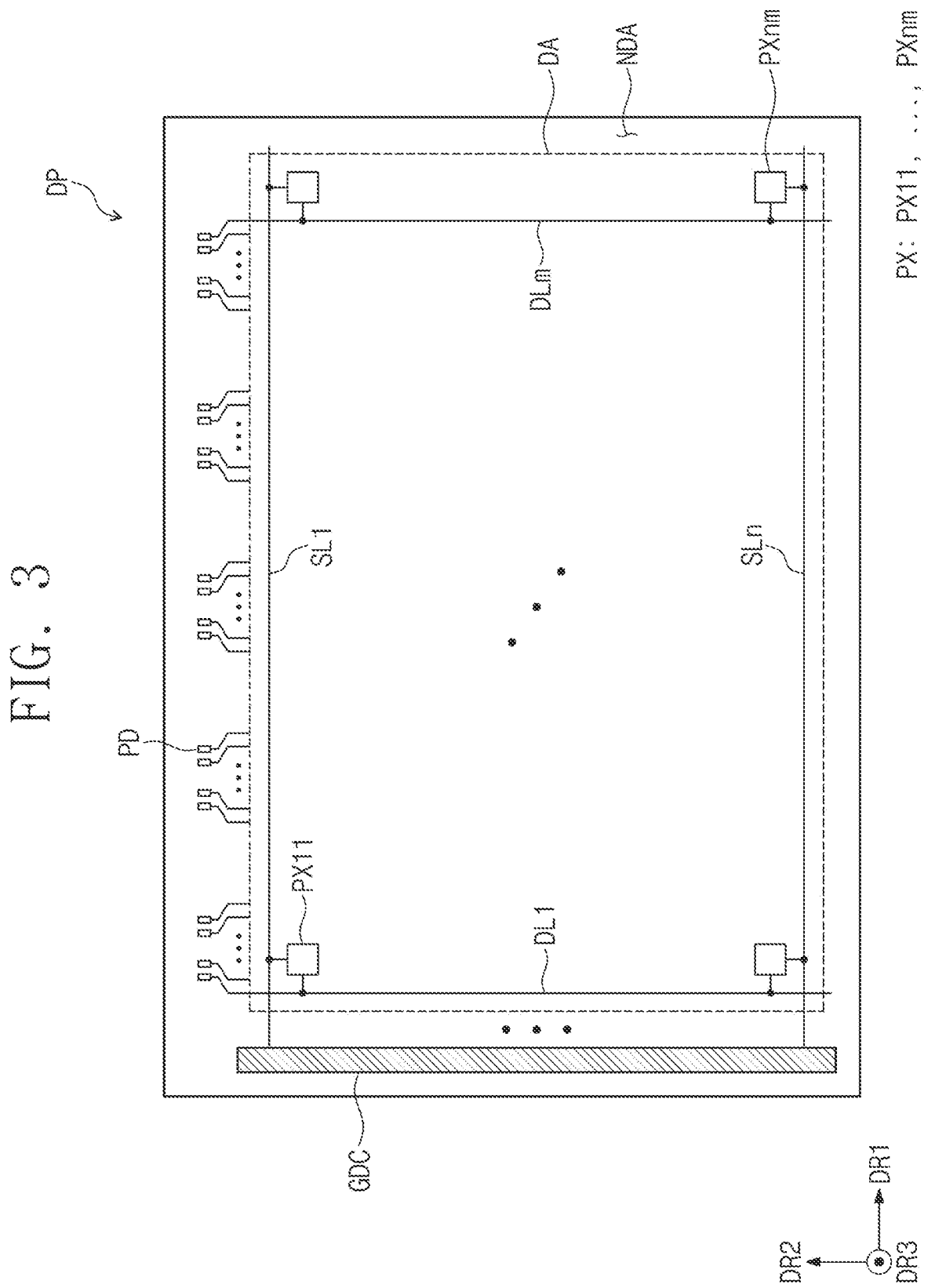
FIG. 3 is a plan view of the display panel according to an embodiment of the present disclosure.
Figure 4:
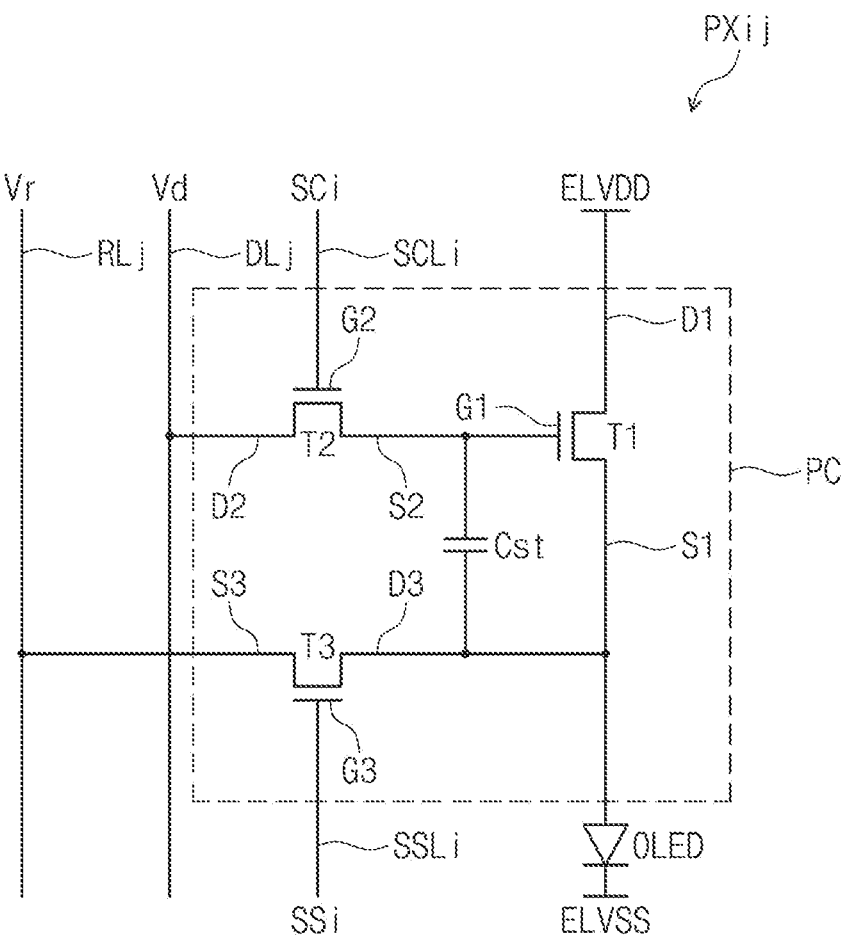
FIG. 4 is an equivalent circuit diagram of a pixel according to an embodiment of the present disclosure.

FIG. 1A is a perspective view of a display panel according to an embodiment of the present disclosure. FIG. 1B is a perspective view of a curved display panel according to an embodiment of the present disclosure. FIG. 2 is a cross-sectional view of the display panel according to an embodiment of the present disclosure. FIG. 3 is a plan view of the display panel according to an embodiment of the present disclosure. FIG. 4 is an equivalent circuit diagram of a pixel according to an embodiment of the present disclosure.

In FIGS. 1A and 1B, the display panels DP and DP-1 are illustrated as light-emitting display panels, and may be any one of a liquid crystal display panel, an electrophoretic display panel, a micro electro mechanical system (MEMS) display panel, an electro wetting display panel, an organic light-emitting display panel, an inorganic light-emitting display panel, and a quantum-dot display panel. However, the present disclosure is not particularly limited thereto.

Referring to FIG. 1A, the display panel DP may display an image through a display surface DP-IS. An upper surface of a member disposed at (e.g., in or on) the uppermost side of the display panel DP may be defined as the display surface DP-IS. According to an embodiment, the upper surface of a window panel WD (e.g., see FIG. 2) may be defined as the display surface DP-IS of the display panel DP.

The display surface DP-IS may be parallel to or substantially parallel to a surface defined by a first direction DR1 and a second direction DR2. A third direction DR3 indicates the normal direction of the display surface DP-IS, or in other words, a thickness direction of the display panel DP. A front surface (or an upper surface) and a rear surface (or a lower surface) of each of the layers or units of the display panel DP, which will be described in more detail below, are distinguished by the third direction DR3.

The display panel DP may include a display region DA and a non-display region NDA. A light-emitting layer EML of a pixel PX (e.g., refer to FIG. 7) is disposed at (e.g., in or on) the display region DA, and the light-emitting layer EML of the pixel PX is not disposed at (e.g., in or on) the non-display region NDA. The non-display region NDA is defined along an edge of the display surface DP-IS. The non-display region NDA may surround (e.g., around a periphery of) the display region DA. In an embodiment of the present disclosure, the non-display region NDA may be omitted as needed or desired, or may be disposed at (e.g., in or on) only one side of the display region DA.

Referring to FIG. 1B, the display panel DP-1 according to an embodiment of the present disclosure may be curved along the first direction DR1 with respect to a virtual axis AX extending in the second direction DR2. However, present disclosure is not limited thereto, and the virtual axis AX may extend in the first direction DR1, or the display panel DP-1 may be curved based on a plurality of axes extending in different directions from each other.

The display panel DP and/or DP-1 may be a rollable display panel, a foldable display panel, or a slidable display panel. The display panel DP and/or DP-1 may have a flexible property, and may be folded and/or rolled after being installed in a display device. Accordingly, the display panel DP and/or DP-1 may include a curved display surface DP-IS or a three-dimensional display surface DP-IS. The three-dimensional display surface DP-IS may include a plurality of display regions which indicate different directions.

FIGS. 1A and 1B illustrate a pixel unit (e.g., a pixel part, a pixel area, or a pixel region) PXU disposed at (e.g., in or on) the display region DA. The pixel unit PXU may include at least one pixel configured to provide light. The pixel unit PXU may include a plurality of pixels configured to provide different light from each other. For example, the pixel unit PXU may be a region in which a plurality of pixels that are configured to provide green light, red light, and blue light are gathered (e.g., are disposed or located). The pixels included in the pixel unit PXU may have a stripe shape, or an RGBG shape (e.g., a PENTILE® shape, PENTILE® being a duly registered trademark of Samsung Display Co., Ltd.).

However, present disclosure is not limited thereto, and the pixels configured to generate different light from each other may be arranged in a triangular shape. For example, a light-emitting region of the pixel configured to provide green light and a light-emitting region of the pixel configured to provide red light may be arranged to be spaced apart from each other along the first direction DR1, and a light-emitting region of the pixel configured to provide blue light may be arranged to be spaced apart from the light-emitting region of the pixel configured to provide green light and the light-emitting region of the pixel configured to provide red light in a diagonal direction relative to each of the first and second directions DR1 and DR2. In this case, from among the light-emitting regions of the pixels, the light-emitting region of the pixel configured to provide red light may have the largest area, and the light-emitting region of the pixel configured to provide blue light may have the smallest area.

In addition, the shapes of the light-emitting region of the pixel configured to provide green light and the light-emitting region of the pixel configured to provide red light may be symmetrical or substantially symmetrical to each other. In this case, the shapes thereof may be the same or substantially the same as (e.g., may be similar to) each other, and the light-emitting regions thereof may have different areas from each other. The light-emitting region of the pixel configured to provide blue light may be symmetrical or substantially symmetrical with respect to an imaginary line crossing a center of the light-emitting region. However, present disclosure is not limited thereto, and the arrangement forms of the pixels configured to provide different light from each other, and the sizes of the areas of the light-emitting regions thereof, are not limited to any particular embodiment.

Referring to FIG. 2, the display panel DP according to an embodiment of the present disclosure includes a base layer BS, a circuit element layer DP-CL disposed on the base layer BS, a display element layer DP-OLED, a thin film encapsulation layer TFE, a light control layer OSL, and a window panel WD. The display panel DP may further include one or more suitable functional layers, for example, such as an anti-reflection layer or a refractive index-adjusting layer. The circuit element layer DP-CL includes a plurality of insulating layers, and a circuit element. The insulating layers, which will be described in more detail below, may include an organic layer and/or an inorganic layer.

The base layer BS may include a synthetic resin layer (e.g., a synthetic resin film). The synthetic resin layer may include (e.g., may contain) a thermosetting resin. For example, the synthetic resin layer may be a polyimide-based resin layer, but the material thereof is not particularly limited thereto. The synthetic resin layer may include at least one of an acrylic-based resin, a methacrylic-based resin, a polyiso-prene, a vinyl-based resin, an epoxy-based resin, a urethane-based resin, a cellulose-based resin, a siloxane-based resin, a polyamide-based resin, or a perylene-based resin. In addition, the base layer may include a glass substrate, a metal substrate, or an organic/inorganic composite material substrate.

An insulating layer, a semiconductor layer, and a conductive layer are formed in the circuit element layer DP-CL through suitable processes, for example, such as coating and deposition. Thereafter, the insulating layer, the semiconductor layer, and the conductive layer may be selectively patterned through photolithography and etching processes. Through such processes, a semiconductor pattern, a conductive pattern, a signal line, and the like may be formed. Patterns disposed at (e.g., in or on) a same layer as each other are formed through the same or substantially the same process as each other.

The circuit element layer DP-CL includes a signal line and a driving circuit to drive the pixel PX. The display element layer DP-OLED may include a pixel defining film PDL, and a light-emitting element OLED included in the pixel PX (e.g., refer to FIG. 7).

The thin film encapsulation layer TFE may be disposed on the display element layer DP-OLED to protect the light-emitting element OLED. The thin film encapsulation layer TFE may include inorganic layers, and an organic layer disposed between the inorganic layers. The inorganic layers may protect the light-emitting element OLED from moisture and/or oxygen, and the organic layer may protect the light-emitting element OLED from foreign substances, for example, such as dust particles.

The light control layer OSL may include color control layers capable of converting optical properties of a source light generated by the light-emitting element OLED. The color control layers may include quantum dots, and the light control layer OSL may further include color filters that selectively transmit light transmitted through the color control layers.

The window panel WD may be disposed on the display panel DP, and may transmit an image provided from the display panel DP to the outside. The window panel WD includes the display region DA and the non-display region NDA. The non-display region NDA may define a boundary of the display region DA. The non-display region NDA may be defined by a bezel pattern, which is disposed under (e.g., underneath) the window panel WD, and the bezel pattern may absorb light.

The window panel WD may include a base layer, and functional layers disposed on the base layer. The functional layers may include a protective layer, an anti-fingerprint layer, and the like. The base layer of the window panel WD may include (e.g., may be composed of) glass, sapphire, plastic, or the like.

FIG. 3 illustrates a planar arrangement relationship of signal lines SL1 to SLn and DL1 to DLm, and pixels PX11 to PXnm included in the display panel DP. The signal lines SL1 to SLn and DL1 to DLm may include a plurality of scan lines SL1 to SLn, and a plurality of data lines DL1 to DLm. Here, n and m may be natural numbers.

Each of the pixels PX11 to PXnm is connected to a corresponding scan line from among the plurality of scan lines SL1 to SLn, and a corresponding data line from among the plurality of data lines DL1 to DLm. Each of the pixels PX11 to PXnm may include a pixel driving circuit and a display element. Various kinds (e.g., different kinds or more kinds) of signal lines may be provided in the display panel DP according to the configurations of the pixel driving circuits of the pixels PX11 to PXnm.

A gate driving circuit GDC may be disposed at (e.g., in or on) the non-display region NDA. The gate driving circuit GDC may be integrated into the display panel DP through an oxide silicon gate (OSG) driving circuit process or an amorphous silicon gate (ASG) driving circuit process.

FIG. 4 illustrates an example of a circuit diagram of one pixel PXij from among the pixels PX11 to PXnm.

Referring to FIG. 4, the pixel PXij may include a pixel circuit PC and a light-emitting element OLED. The pixel circuit PC may include a plurality of transistors T1, T2, and T3, and a capacitor Cst.

The plurality of transistors T1, T2, and T3 may be formed through a low temperature polycrystalline silicon (LTPS) process or a low temperature polycrystalline oxide (LTPO) process. Each of the first to third transistors T1 to T3 may include any one of a silicon semiconductor and an oxide semiconductor. In this case, the oxide semiconductor may include a crystalline or amorphous oxide semiconductor, and the silicon semiconductor may include (e.g., may contain) amorphous silicon, polycrystalline silicon, and/or the like. However, the present disclosure is not limited to any particular embodiment.

Hereinafter, for convenience, the first to third transistors T1 to T3 are described as N-type transistors, but present disclosure is not limited thereto, and each of the first to third transistors T1 to T3 may be a P-type transistor or an N-type transistor according to an applied signal. A source and drain of the P-type transistor may correspond to the drain and source of the N-type transistor, respectively.

FIG. 4 illustrates an example of the pixel PXij connected to an i-th scan line SCLi, an i-th sensing line SSLi, a j-th data line DLj, and a j-th reference line RLj. Here, i may be a natural number greater than or equal to 1 and less than or equal to n, and j may be a natural number greater than or equal to 1 and less than or equal to m.

The pixel PXij illustrated in FIG. 4 may correspond to any one of the pixels included in the pixel unit PXU. The pixel circuit PC may include a first transistor T1 (e.g., a driving transistor), a second transistor T2 (e.g., a switching transistor), a third transistor T3 (e.g., a sensing transistor), and the capacitor Cst. However, the pixel circuit PC may further include an additional transistor and/or an additional capacitor, and the present disclosure is not limited to any particular embodiment.

Each of the first to third transistors T1 to T3 may include a source S1, S2, or S3, a drain D1, D2, or D3, and a gate G1, G2, or G3.

The light-emitting element OLED may be an organic light-emitting element or an inorganic light-emitting element. The light-emitting element OLED may include an anode (e.g., a first electrode) and a cathode (e.g., a second electrode). The anode of the light-emitting element OLED may receive a first voltage ELVDD through the first transistor T1, and the cathode of the light-emitting element OLED may receive a second voltage ELVSS. The light-emitting element OLED may receive the first voltage ELVDD and the second voltage ELVSS to emit light.

The first transistor T1 may include a drain D1 to receive the first voltage ELVDD, a source S1 connected to the anode of the light-emitting element OLED, and a gate G1 connected to the capacitor Cst. The first transistor T1 may control a driving current flowing through the light-emitting element OLED from the first voltage ELVDD in response to a voltage value stored in the capacitor Cst.

The second transistor T2 may include a drain D2 connected to the j-th data line DLj, a source S2 connected to the capacitor Cst, and a gate G2 to receive an i-th writing scan signal SCi. The second transistor T2 provides a data voltage Vd to the first transistor T1 in response to the i-th writing scan signal SCi.

The third transistor T3 may include a source S3 connected to the j-th reference line RLj, a drain D3 connected to the anode of the light-emitting element OLED, and a gate G3 to receive an i-th sampling scan signal SSi. The j-th reference line RLj may receive a reference voltage Vr.

The capacitor Cst may store voltage differences of various values according to input signals. For example, the capacitor Cst may store a voltage corresponding to a difference between a voltage transmitted from the second transistor T2 and the first voltage ELVDD.

An equivalent circuit of the pixel PXij is not limited to the equivalent circuit illustrated in FIG. 4. In other embodiments of the present disclosure, the pixel PXij may be implemented in various suitable forms in order to suitably emit light from the light-emitting element OLED.

Figure 5:
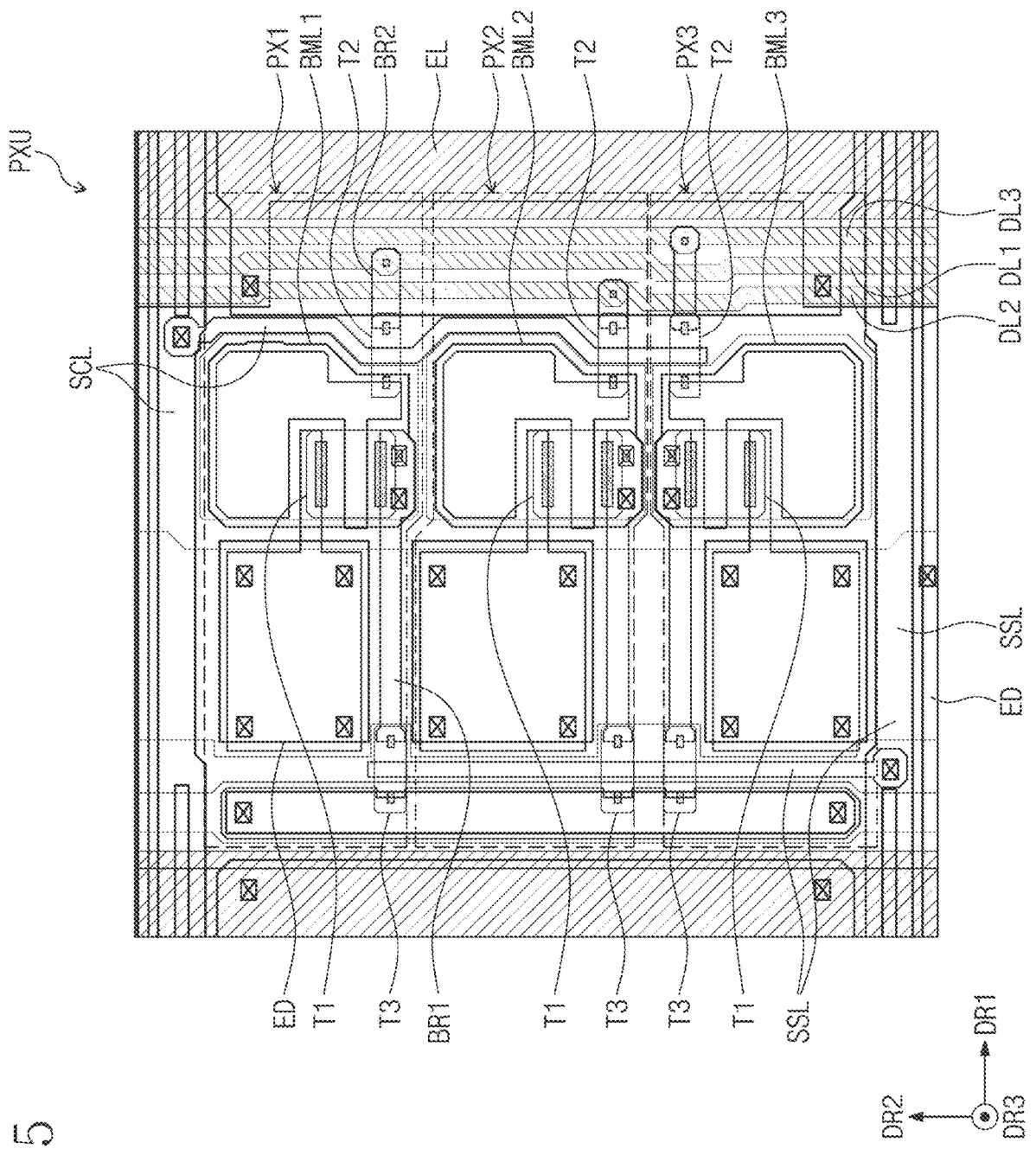
FIG. 5 is a plan view illustrating a stacking order of a plurality of conductive patterns included in a pixel unit according to an embodiment of the present disclosure.
Figure 7:
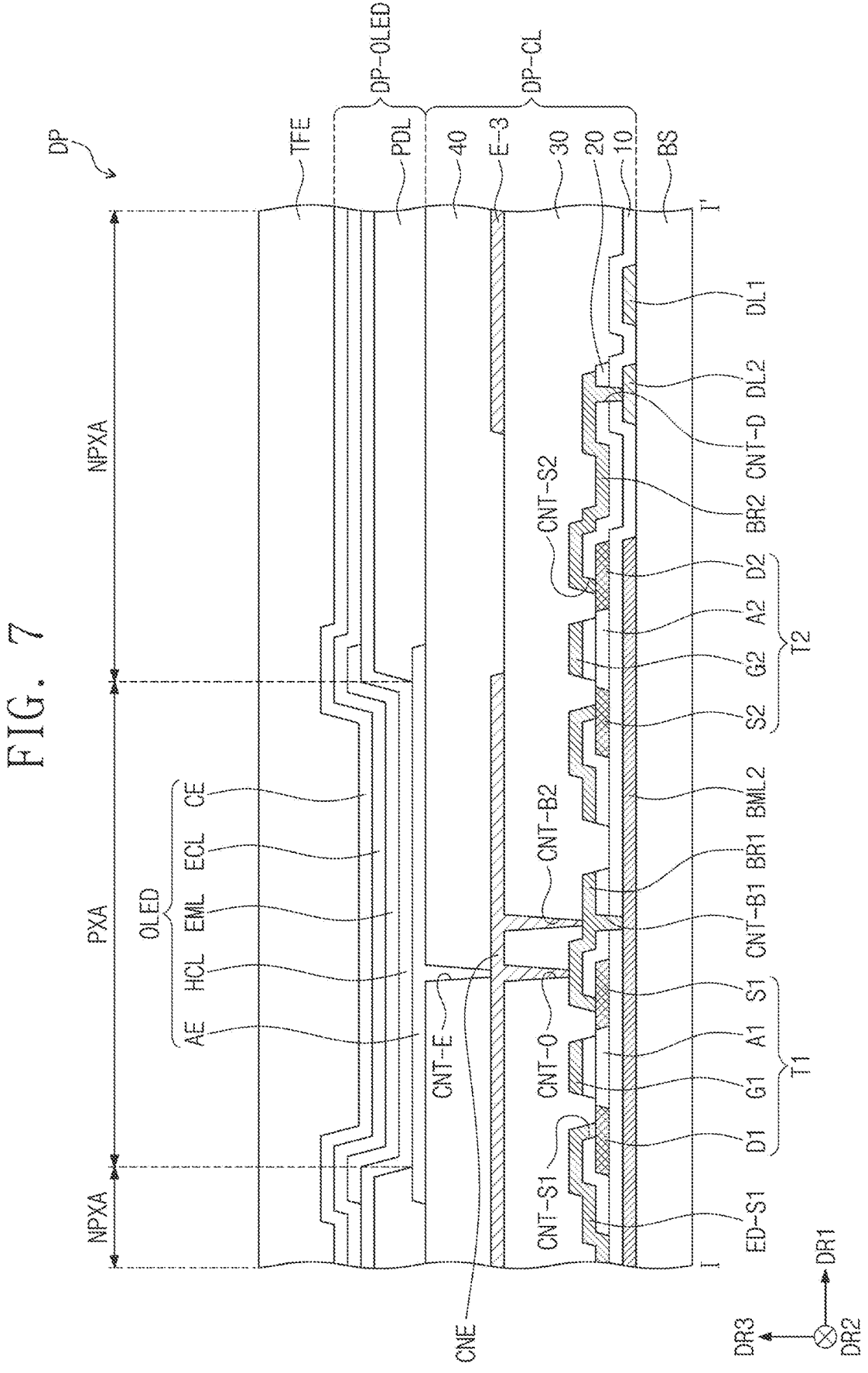
FIG. 7 is a cross-sectional view taken along the line I-I' illustrated in FIG. 6G.
Figure 8:
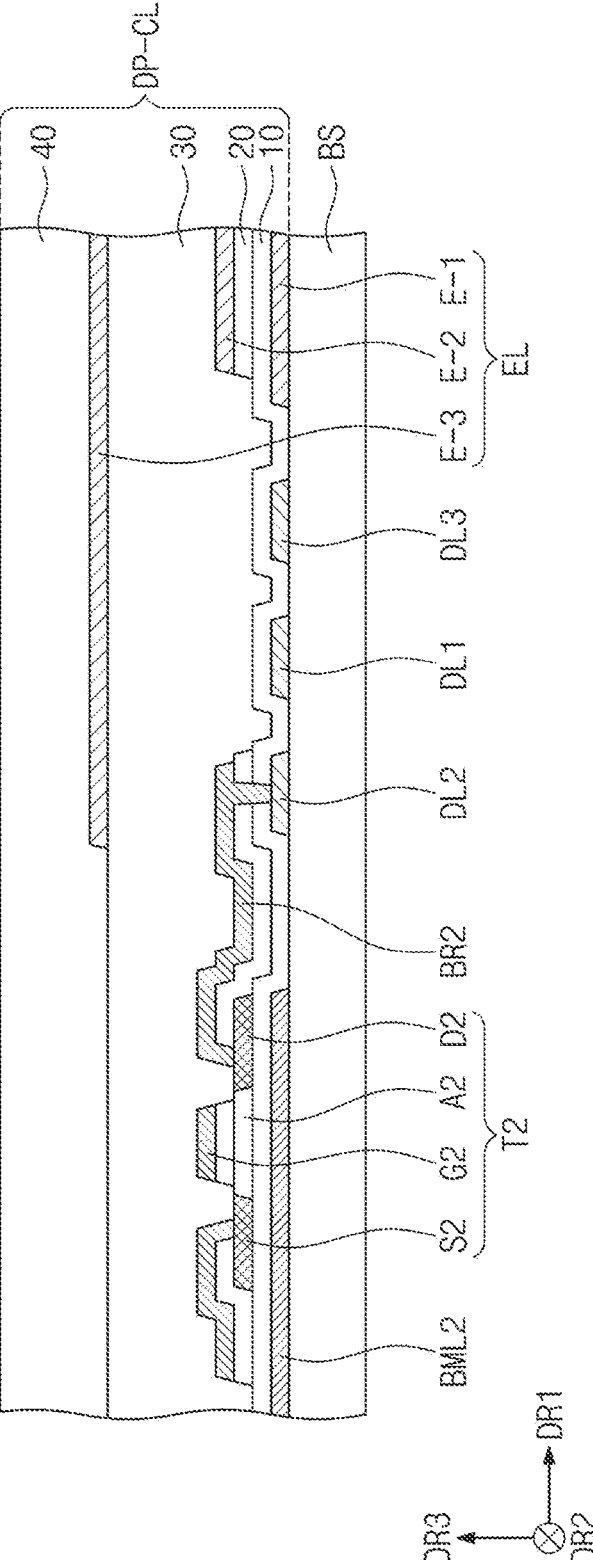
FIG. 8 is a cross-sectional view of a display panel according to an embodiment of the present disclosure.

FIG. 5 is a plan view illustrating a stacking order of a plurality of conductive patterns included in a pixel unit according to an embodiment of the present disclosure. FIGS. 6A to 6G are plan views in which the stacking order of the plurality of conductive patterns included in the pixel unit according to an embodiment of the present disclosure is divided by layers. FIG. 7 is a cross-sectional view taken along the line I-I' illustrated in FIG. 6G. FIG. 8 is a cross-sectional view of a display panel according to an embodiment of the present disclosure.

FIG. 5 illustrates an arrangement relationship of pixels PX1, PX2, and PX3 included in the pixel unit PXU (e.g., refer to FIG. 1A), and components included in a driving element. FIGS. 6A to 6G illustrate separated layers of the components illustrated in FIG. 5.

The pixel unit PXU according to one or more embodiments of the present disclosure may include three pixels PX1, PX2, and PX3, and driving elements connected to the pixels PX1, PX2, and PX3. The pixels PX1, PX2, and PX3 are connected to a first power line ED, a second power line EL, a scan line SCL, and a sensing line SSL. In addition, the pixels PX1, PX2, and PX3 may be connected to corresponding data lines DL1, DL2, and DL3. The first power line ED may provide the first voltage ELVDD, and the second power line EL may provide the second voltage ELVSS (e.g., refer to FIG. 4), which is lower than the first voltage ELVDD.

Each of the pixels PX1, PX2, and PX3 according to one or more embodiments of the present disclosure may include first, second, and third transistors T1, T2, and T3, and a capacitor Cst (e.g., refer to FIG. 4). An equivalent circuit diagram of the first to third transistors T1, T2, and T3 and the capacitor Cst included in each of the first to third pixels PX1, PX2, and PX3 may be the same or substantially the same as that described above with reference to FIG. 4, and thus, redundant description thereof may not be repeated.

Figure 6A:
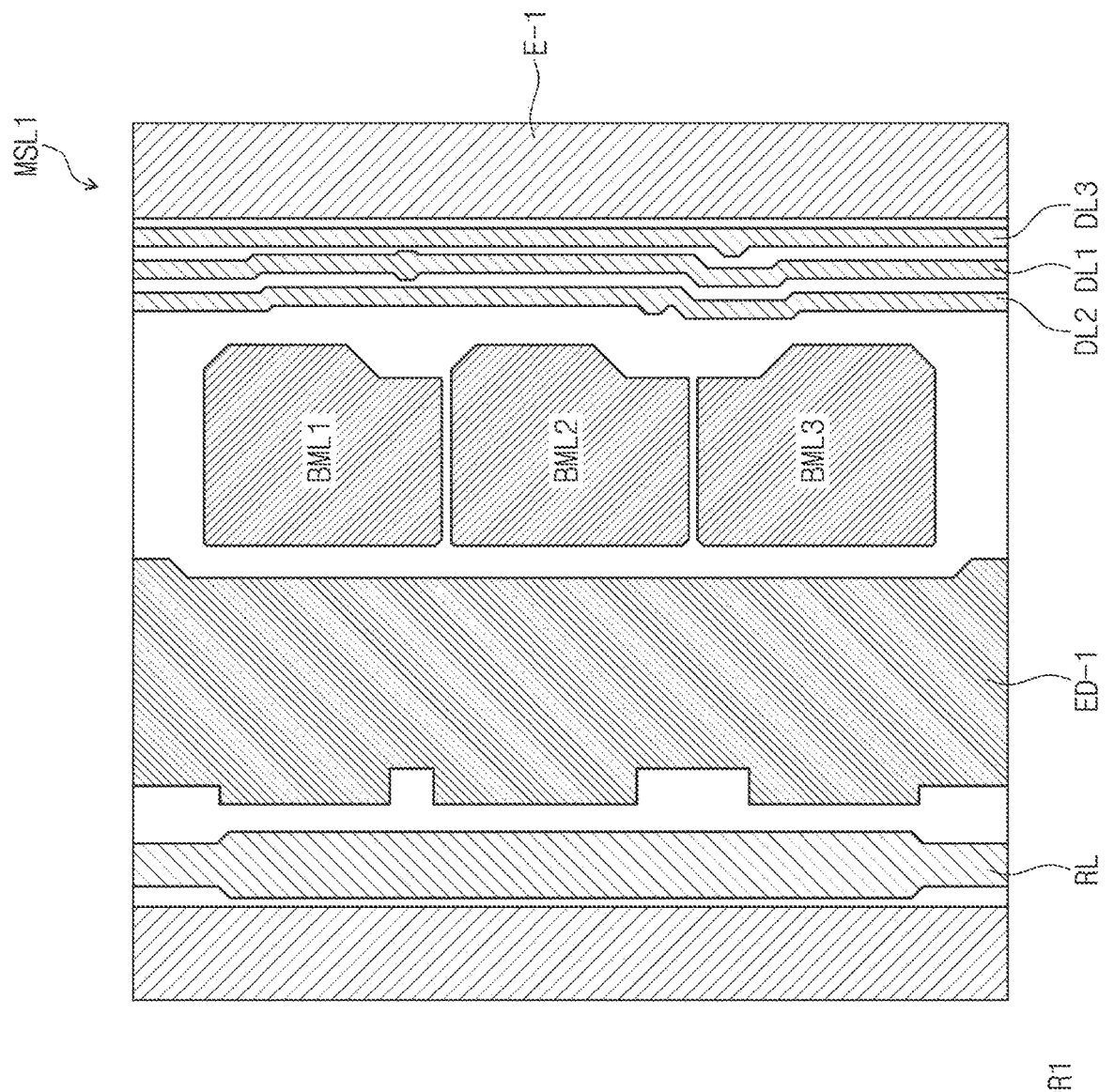
FIGS. 6A-6G are plan views in which the stacking order of a plurality of conductive patterns included in the pixel according to an embodiment of the present disclosure is divided by layers.

Referring to FIGS. 5 and 6A, a first conductive layer MSL1 according to one or more embodiments of the present disclosure may include a reference line RL, a first power pattern ED-1 from among the first power line ED, a plurality of light blocking patterns BML1, BML2, and BML3, first to third data lines DL1, DL2, and DL3, and a first line E-1 from among the second power line EL.

The first to third data lines DL1, DL2, and DL3 may be spaced apart from each other in the first direction DR1, and each of the first to third data lines DL1, DL2, and DL3 may extend along the second direction DR2.

The reference line RL and the first power pattern ED-1 may extend along the second direction DR2, and may be spaced apart from each other in the first direction DR1.

The first line E-1 may be a line of the second power line EL that is disposed in the lowermost layer from among the layers of the second power line EL, and may extend in the second direction DR2. Accordingly, the first line E-1 may extend in the same or substantially the same direction as those of the first to third data lines DL1, DL2, and DL3 and the reference line RL.

The first power pattern ED-1 from among the first power line ED may extend in the second direction DR2. The first power pattern ED-1 may be disposed between the reference line RL and the light blocking patterns BML1, BML2, and BML3.

The light blocking patterns BML1, BML2, and BML3 may be disposed between the second data line DL2 and the first power pattern ED-1, and may be spaced apart from each other in the second direction DR2.

The first conductive layer MSL1 may be covered by a first insulating layer 10 (e.g., refer to FIG. 7). The first insulating layer 10 may be a buffer layer. The first insulating layer 10 will be described in more detail below.

Figure 6B:
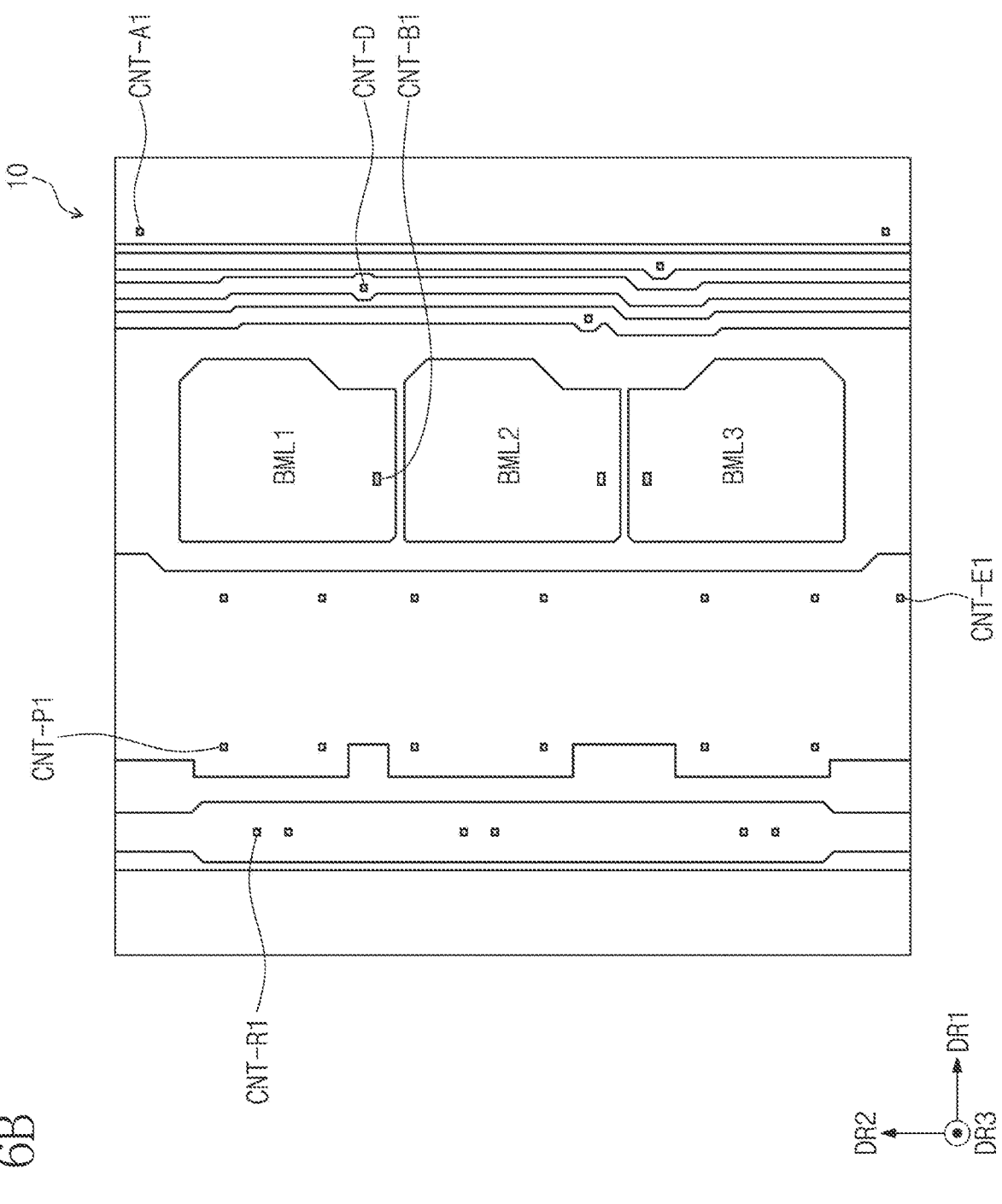

FIG. 6B illustrates contact holes formed in the first insulating layer 10. The first insulating layer 10 is disposed on the base layer BS to cover the first conductive layer MSL1. A plurality of contact holes passing through (e.g., penetrating) the first insulating layer 10, and exposing a portion of the first conductive layer MSL1, may be defined in the first insulating layer 10.

First power contact holes CNT-P1 may expose a portion of the first power pattern ED-1. First reference contact holes CNT-R1 may expose a portion of the reference line RL. First additional contact holes CNT-A1 may expose a portion of the first line E-1.

First data contact holes CNT-D1 may expose a portion of corresponding data lines from among the first to third data lines DL1, DL2, and DL3.

First light blocking contact holes CNT-B1 may expose a portion of corresponding light blocking patterns from among the first to third light blocking patterns BML1, BML2, and BML3.

A first line contact hole CNT-E1 may expose a portion of the first power pattern ED-1. The first line contact hole CNT-E1 may overlap with a second line contact hole CNT-E2 defined in a third insulating layer 30, which will be described in more detail below.

A second power pattern ED-2 included in a fourth conductive layer MSL4, which will be described in more detail below, may be connected to the first power pattern ED-1 through the first line contact hole CNT-E1 and the second line contact hole CNT-E2. Accordingly, the first power pattern ED-1 and the second power pattern ED-2 may constitute the first power line ED.

Figure 6C:
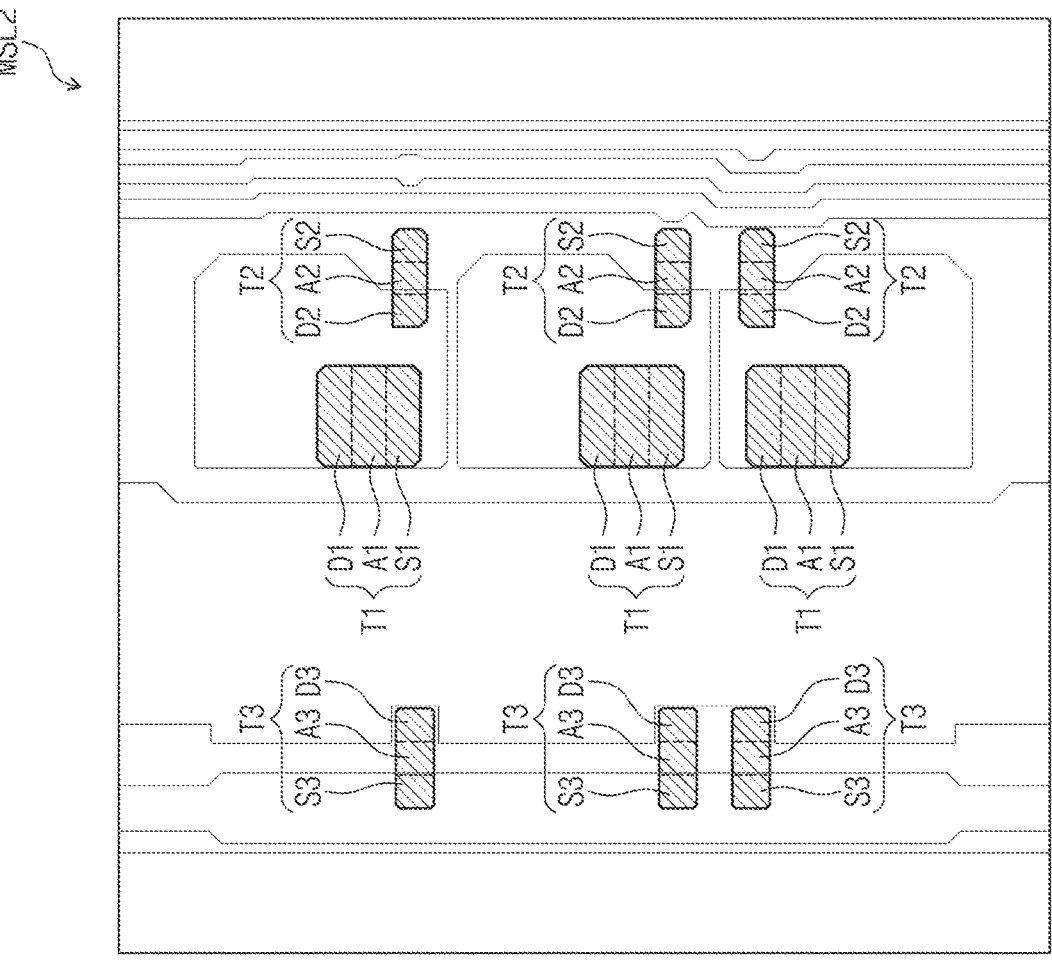
Figure 6C:
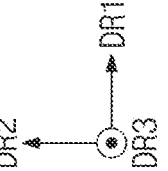

Referring to FIGS. 5 and 6C, a second conductive layer MSL2 according to one or more embodiments of the present disclosure may be disposed on the first insulating layer 10. The second conductive layer MSL2 may include a semiconductor layer included in each of the first to third transistors T1, T2, and T3.

The semiconductor layer included in the first transistor T1 may include a source S1, a drain D1, and a channel region A1. The channel region A1 may be disposed between the source S1 and the drain D1. The semiconductor layer included in the second transistor T2 may include a source S2, a drain D2, and a channel region A2. The channel region A2 may be disposed between the source S2 and the drain D2. The semiconductor layer included in the third transistor T3 may include a source S3, a drain D3, and a channel region A3. The channel region A3 may be disposed between the source S3 and the drain D3.

The regions included in each of the semiconductor layers may be divided into the source, the drain, and the channel region after a reduction process is performed by using a gate as a mask, which will be described in more detail below. However, present disclosure is not limited thereto, and the roles of the sources and drains included in the first to third transistors T1, T2, and T3 may be variously modified as needed or desired according to applied voltages.

Each of the semiconductor layers may be formed of an oxide semiconductor layer. However, present disclosure is not limited thereto, and the semiconductor layers may be formed of amorphous silicon or polycrystalline silicon, and the present disclosure is not limited to any particular embodiment.

The second conductive layer MSL2 may be covered by a second insulating layer 20 (e.g., refer to FIG. 7), which will be described in more detail below.

Figure 6D:
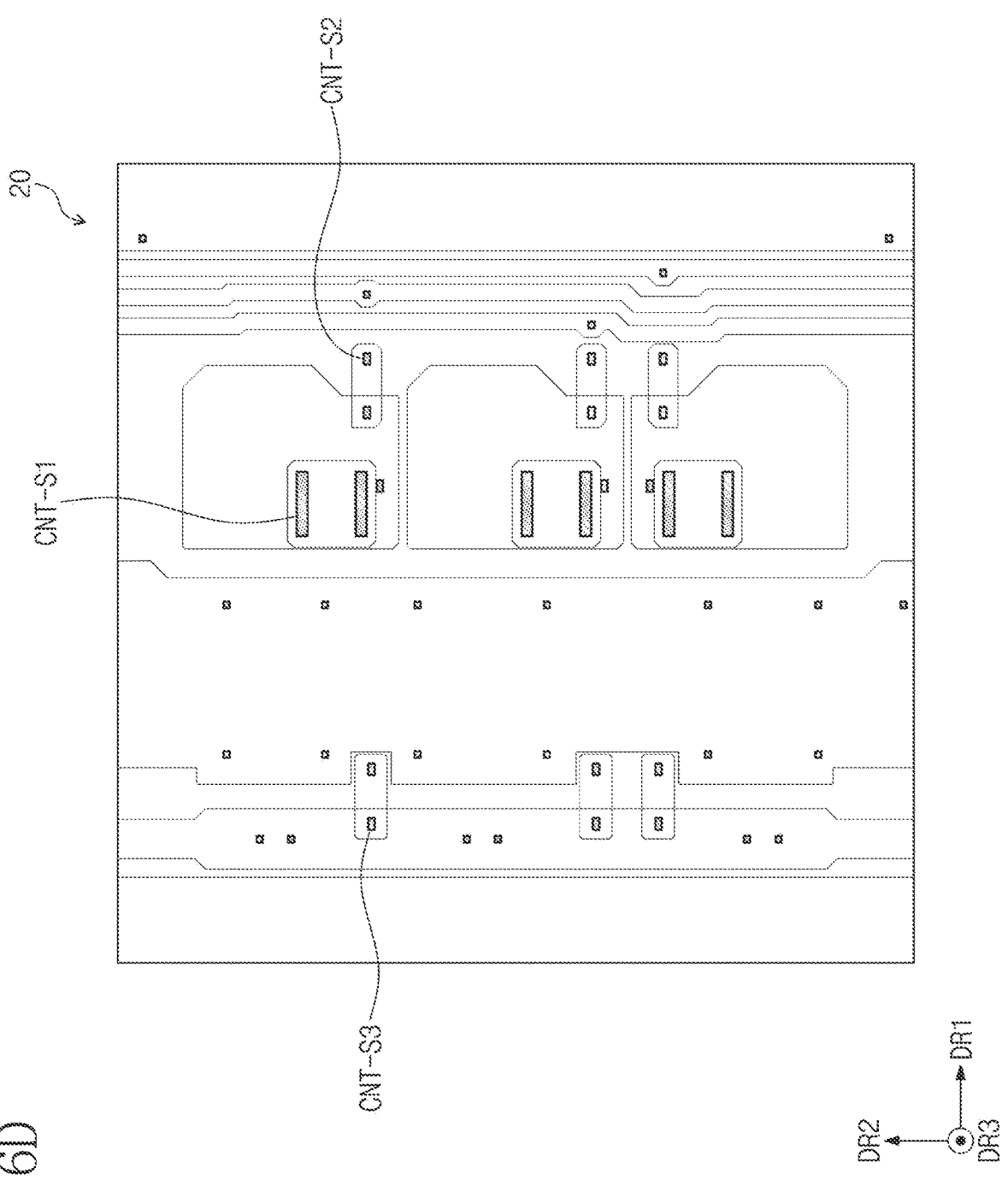

FIG. 6D illustrates contact holes formed in the second insulating layer 20. The second insulating layer 20 is disposed on the first insulating layer 10 (e.g., refer to FIG. 7) to cover the second conductive layer MSL2. A plurality of contact holes passing through (e.g., penetrating) the second insulating layer 20, and exposing a portion of the second conductive layer MSL2, may be defined in the second insulating layer 20.

First semiconductor contact holes CNT-S1 may expose portions of the source S1 and the drain D1 included in the first transistor T1.

Second semiconductor contact holes CNT-S2 may expose portions of the source S2 and the drain D2 included in the second transistor T2.

Third semiconductor contact holes CNT-S3 may expose portions of the source S3 and the drain D3 included in the third transistor T3.

Figure 6E:
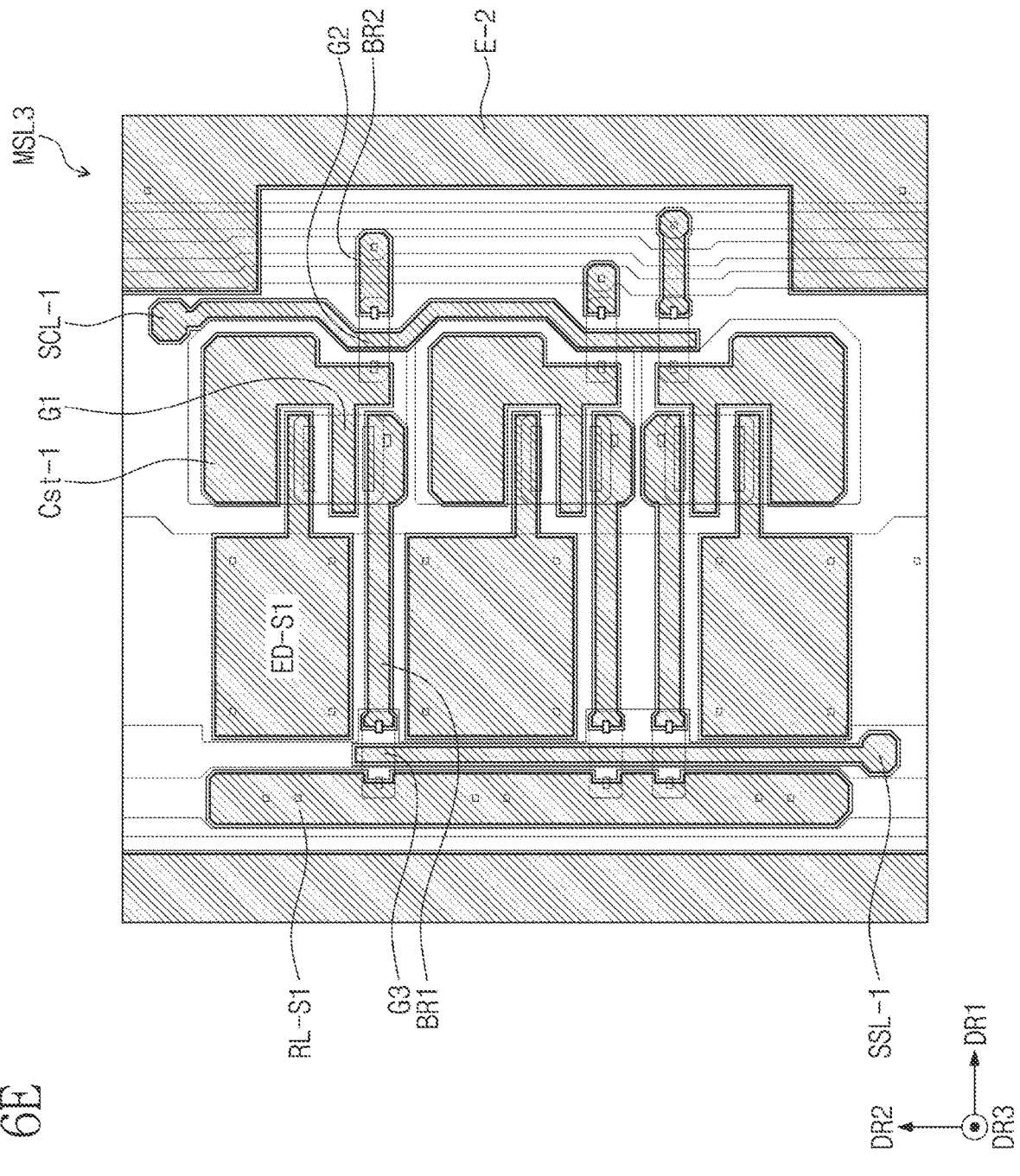

Referring to FIGS. 5 and 6E, a third conductive layer MSL3 may be disposed on the second insulating layer 20. The third conductive layer MSL3 may include a portion SCL-1 of the scan line SCL extending in the second direction DR2, a portion SSL-1 of the sensing line SSL extending in the second direction DR2, and a portion Cst-1 of the capacitor Cst.

The third conductive layer MSL3 may include a first additional reference line RL-S1, a first bridge pattern BR1, a first additional power line ED-S1, a second bridge pattern BR2, an additional line E-2 of the second power line EL, and a gate G1, G2, and G3 of each of the first to third transistors T1, T2, and T3.

The first additional reference line RL-S1 may overlap with the reference line RL. The first additional reference line RL-S1 and the source S3 of the third transistor T3 may be connected to each other through a third semiconductor contact hole CNT-S3 defined in the second insulating layer 20.

The first bridge pattern BR1 may connect the drain D3 of the third transistor T3 and the source S1 of the first transistor T1 to each other. The first bridge pattern BR1 may extend in the first direction DR1.

One end of the first bridge pattern BR1 may be disposed in the third semiconductor contact hole CNT-S3 overlapping with the drain D3 of the third transistor T3 to be connected to the drain D3 of the third transistor T3. The other end opposite to the one end of the first bridge pattern BR1 may be disposed in a first semiconductor contact hole CNT-S1 overlapping with the source S1 of the first transistor T1 to be connected to the source S1 of the first transistor T1.

The first additional power line ED-S1 may overlap with a portion of the first power line ED, and may be connected to the drain D1 of the first transistor T1. A portion of the first additional power line ED-S1 overlapping with the first power line ED may be disposed in the first power contact holes CNT-P1 to be connected to the first power line ED. A portion of the additional power line ED-S1 overlapping with the drain D1 of the first transistor T1 may be disposed in the first semiconductor contact hole CNT-S1 to be connected to the drain D1 of the first transistor T1.

The second bridge pattern BR2 may connect the source S2 of the second transistor T2 and the first data line DL1 to each other.

One end of the second bridge pattern BR2 may be disposed in a second semiconductor contact hole CNT-S2 overlapping with the source S2 of the second transistor T2 to be connected to the source S2 of the second transistor T2. The other end opposite to the one end of the second bridge pattern BR2 may be disposed in a data contact hole CNT-D overlapping with the first data line DL1 to be connected to the first data line DL1.

While a relationship between the first data line DL1 and the second bridge pattern BR2 has been described above, the above description may be applied to the connection relationship between the data lines DL2 and DL3 and the drain D2 of the second transistor T2 included in the second and third pixels PX2 and PX3 in the same or substantially the same manner, and thus, redundant description thereof may not be repeated.

The additional line E-2 of the second power line EL may overlap with the first line E-1. The additional line E-2 may be disposed at (e.g., in or on) a layer different from that of the first data line DL1, and may extend along the second direction DR2, which is the same or substantially the same direction in which the first data line DL1 extends. According to the present embodiment, the first line E-1 may be spaced apart from the first data line DL1, and the additional line E-2 may overlap with both ends (e.g., opposite ends) of the first data line DL1 while being spaced apart from a central portion of the first data line DL1. Accordingly, end portions of the additional line E-2 that are spaced apart from each other along the second direction DR2 may overlap with the first to third data lines DL1, DL2, and DL3, and a remaining portion of the additional line E-2, or in other words, a central portion of the additional line E-2, may be spaced apart from the first to third data lines DL1, DL2, and DL3 in the first direction DR1.

The additional line E-2 may be disposed in the first additional contact holes CNT-A1 to be connected to the first line E-1.

According to one or more embodiments of the present disclosure, the third conductive layer MSL3 may include the gates G1, G2, and G3 included in the first to third transistors T1, T2, and T3.

A portion of the third conductive layer MSL3 overlapping with the channel region A1 of the first transistor T1 may be defined as the gate G1 of the first transistor T1, and a portion of the third conductive layer MSL3 adjacent thereto may be defined as a portion of the capacitor Cst.

In addition, a portion of the portion SCL-1 of the scan line SCL overlapping with the channel region A2 of the second transistor T2 may be defined as the gate G2 of the second transistor T2, and a portion of the portion SSL-1 of the sensing line SSL overlapping with the channel region A3 of the third transistor T3 may be defined as the gate G3 of the third transistor T3.

A reduction process of the semiconductor layers included in each of the first to third transistors T1, T2, and T3 is performed by using the gates G1, G2, and G3 as a mask, and each of the source and the drain thereof may have a greater conductivity than the channel region thereof.

According to one or more embodiments of the present disclosure, the first bridge pattern BR1 connecting the first and third transistors T1 and T3 to each other and the second bridge pattern BR2 connecting the second transistor T2 and the first data line DL1 to each other may be formed at (e.g., in or on) the same layer as that of which patterns defining the gate G1, G2, and G3 of each of the first to third transistors T1, T2, and T3 are formed.

The third conductive layer MSL3 may be covered by the third insulating layer 30.

Figure 6F:
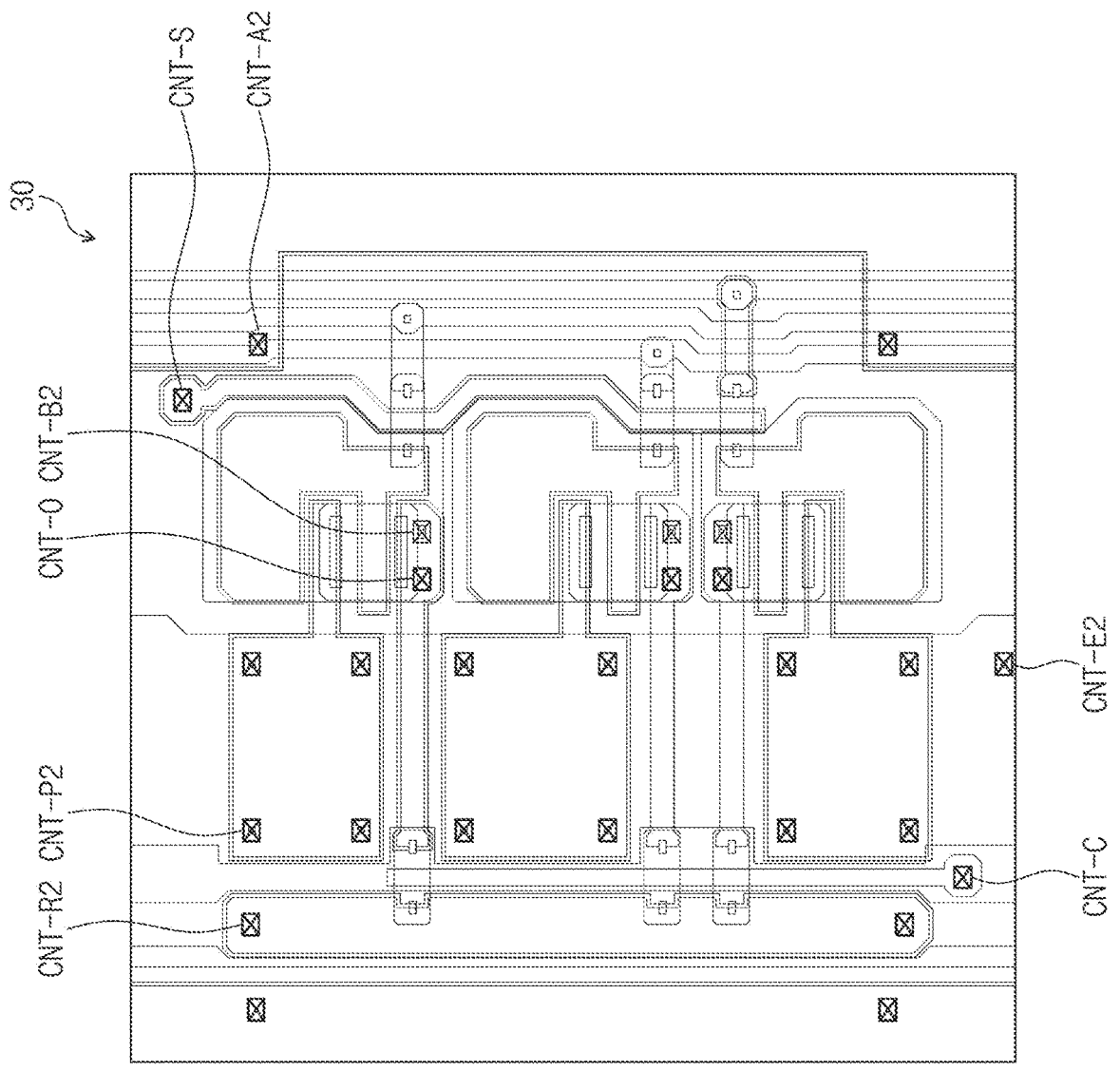

FIG. 6F illustrates contact holes formed in the third insulating layer 30. The third insulating layer 30 is disposed on the second insulating layer 20 to cover the third conductive layer MSL3. A plurality of contact holes passing through (e.g., penetrating) the third insulating layer 30, and exposing a portion of the third conductive layer MSL3, may be defined in the third insulating layer 30.

Second reference contact holes CNT-R2 may expose a portion of the first additional reference line RL-S1.

The scan contact holes CNT-S and CNT-C may expose a corresponding portion SCL-1 of the scan line, and a corresponding portion SSL-1 of the sensing line, respectively.

A source contact hole CNT-O may expose the first bridge pattern BR1 overlapping with the source S1 of the first transistor T1.

Second power contact holes CNT-P2 may expose a portion of the first additional power line ED-S1. Second additional contact holes CNT-A2 may expose a portion of the additional line E-2.

A second light blocking contact hole CNT-B2 may overlap with a first light blocking contact hole CNT-B1, and may expose a portion of the first bridge pattern BR1.

The second line contact hole CNT-E2 may overlap with the first line contact hole CNT-E1, and may expose a portion of the first power pattern ED-1.

According to one or more embodiments of the present disclosure, after the contact holes are formed in the second insulating layer 20, the third conductive layer MSL3 is formed by patterning the conductive layer formed on the second insulating layer 20. Thereafter, portions of the second insulating layer 20 may be removed by using the conductive patterns formed at (e.g., in or on) the third conductive layer MSL3 as a mask.

Thus, according to one or more embodiments of the present disclosure, the second insulating layer 20 may be covered by the third conductive layer MSL3.

Figure 6G:
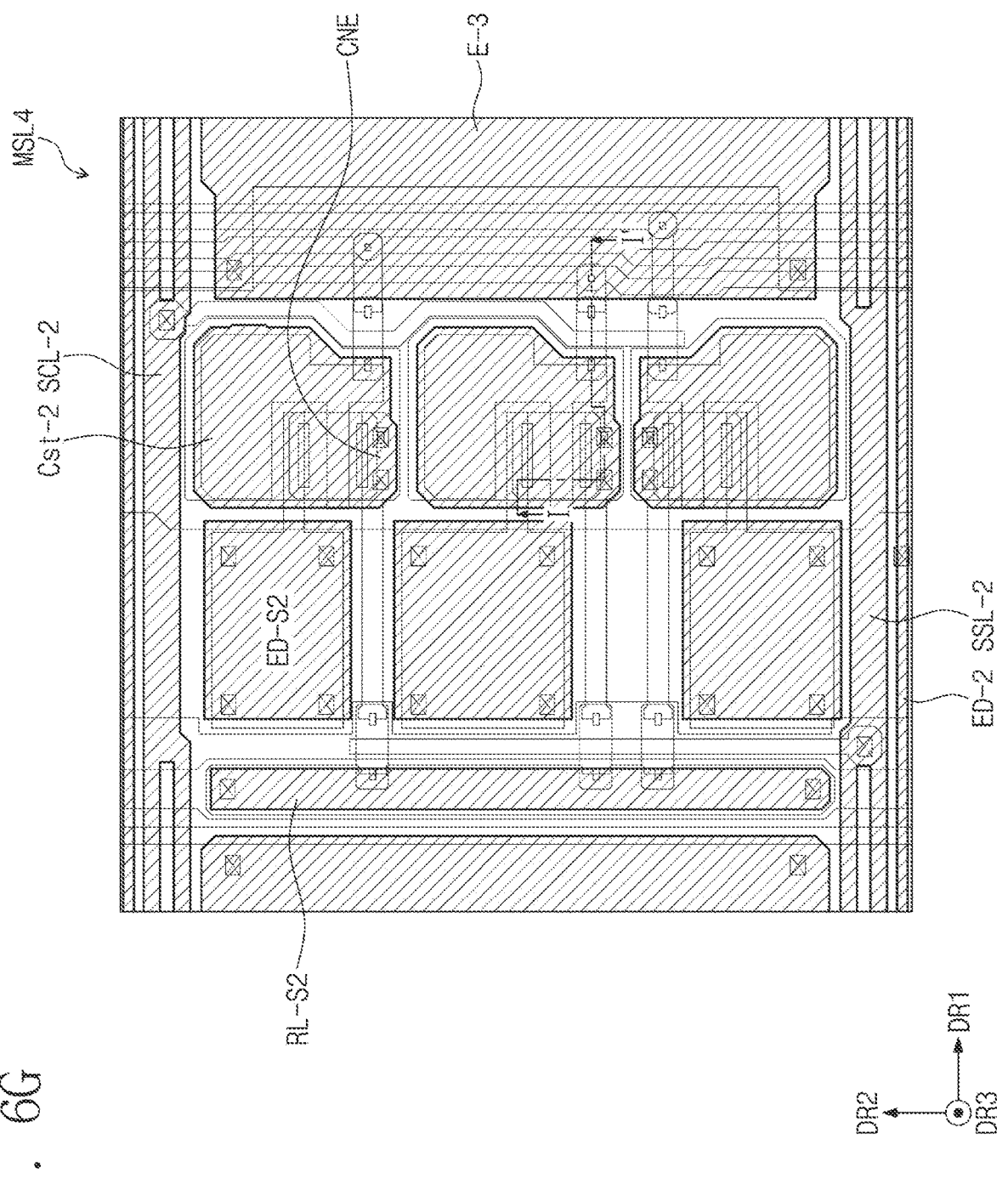

Referring to FIGS. 5 and 6G, the fourth conductive layer MSL4 may be disposed on the third conductive layer MSL3. The fourth conductive layer MSL4 may include the remaining portion SCL-2 of the scan line SCL extending in the first direction DR1, the remaining portion SSL-2 of the sensing line SSL extending in the first direction DR1, the remaining portion Cst-2 of the capacitor Cst, and the second power pattern ED-2.

A region of the fourth conductive layer MSL4 overlapping with the first bridge pattern BR1 may be defined as a connection pattern CNE. One end of the connection pattern CNE may be disposed in the source contact hole CNT-O to be connected to the first bridge pattern BR1, and may be connected to the source S1 of the first transistor T1 through the first bridge pattern BR1. The other end opposite to the one end of the connection pattern CNE may be disposed in the second light blocking contact hole CNT-B2 to be connected to the first light blocking pattern BML1. The connection pattern CNE may be connected to a first electrode AE (e.g., refer to FIG. 7) of the light-emitting element OLED, which will be described in more detail below.

The fourth conductive layer MSL4 may include a second line E-3 from among the second power line EL. The second line E-3 may overlap with the first line E-1 and the additional line E-2, and may extend in the second direction DR2.

The second line E-3 may be disposed in the second additional contact holes CNT-A2 to be connected to the additional line E-2. The additional line E-2 may be disposed in the first additional contact holes CNT-A1 to be connected to the first line E-1.

The second power pattern ED-2 may be connected to the first power pattern ED-1 through the first line contact hole CNT-E1 and the second line contact hole CNT-E2. The first power pattern ED-1 and the second power pattern ED-2 may constitute the first power line ED.

The conductive patterns included in the fourth conductive layer MSL4 may be provided in a plurality of layers. For example, the fourth conductive layer MSL4 may be provided as a two-layer metal layer stacked with titanium (Ti)/copper (Cu), or a three-layer metal layer stacked with titanium (Ti)/aluminum (AD/titanium (Ti).

Referring to FIGS. 7 and 8, the display panel DP may include a base layer BS, a circuit element layer DP-CL disposed on the base layer BS, a display element layer DP-OLED, and a thin film encapsulation layer TFE. In FIG. 7, the window panel WD and the light control layer OSL described above with reference to FIG. 2 are omitted for convenience of illustration.

The circuit element layer DP-CL may include first to fourth insulating layers 10, 20, 30, and 40, and first to fourth conductive layers MSL1, MSL2, MLS3, and MLS4. According to an embodiment of the present disclosure, the first insulating layer 10 and the second insulating layer 20 may be inorganic layers, and the third insulating layer 30 and the fourth insulating layer 40 may be organic layers. The first to fourth conductive layers MSL1, MSL2, MLS3, and MLS4 may correspond to the first to fourth conductive layers MSL1, MSL2, MLS3, and MLS4 described above with reference to FIGS. 6A to 6G, and thus, redundant description thereof may not be repeated.

The display element layer DP-OLED may include a light-emitting element OLED and a pixel defining film PDL.

The first electrode AE of the light-emitting element OLED is disposed on the fourth insulating layer 40. The first electrode AE may be an anode. The pixel defining film PDL is disposed on the fourth insulating layer 40.

An opening of the pixel defining film PDL exposes at least a portion of the first electrode AE. The opening of the pixel defining film PDL may be defined as a light-emitting region PXA configured to provide light.

A hole control layer HCL may be disposed in common in the light-emitting region PXA and a non-light-emitting region NPXA. A common layer, such as the hole control layer HCL, may be formed in common in a plurality of pixels PX. The hole control layer HCL may include a hole transport layer and a hole injection layer.

A light-emitting layer EML is disposed on the hole control layer HCL. The light-emitting layer EML may be disposed at (e.g., in or on) a region corresponding to the opening OP. The light-emitting layer EML may be formed separately in each of the plurality of pixels PX.

Although a patterned light-emitting layer EML is illustrated as an example according to the present embodiment, the light-emitting layer EML may be commonly disposed in the plurality of pixels PX. The commonly disposed light-emitting layer EML may generate white light or blue light. In addition, the light-emitting layer EML may have a multi-layered structure.

An electron control layer ECL is disposed on the light-emitting layer EML. The electron control layer ECL may include an electron transport layer and an electron injection layer. A second electrode CE is disposed on the electron control layer ECL. The electron control layer ECL and the second electrode CE may be commonly disposed in the plurality of pixels PX.

The thin film encapsulation layer TFE is disposed on the second electrode CE. The thin film encapsulation layer TFE is commonly disposed on the plurality of pixels PX. In the present embodiment, the thin film encapsulation layer TFE directly covers the second electrode CE.

The thin film encapsulation layer TFE includes at least one inorganic layer and/or an organic layer. The inorganic layer according to an embodiment of the present disclosure may be provided in a plurality to be disposed above and below the organic layer. In addition, any one of the inorganic layer and the organic layer may include two or more layers, and present disclosure is not limited thereto. The second light blocking pattern BML2 of the first conductive layer MSL1 is disposed on the base layer BS. The second light blocking pattern BML2 may overlap with the first and second transistors T1 and T2. The second light blocking pattern BML2 may prevent or substantially prevent the conductive patterns included in the circuit element layer DP-CL from being viewed due to external light, and/or may prevent or substantially prevent the semiconductor layers included in the first to third transistors T1, T2, and T3 from being damaged by external light.

The first additional power line ED-S1 of the second conductive layer MSL2 may be disposed in the first semiconductor contact hole CNT-S1 to be connected to the drain D1 of the first transistor T1.

One end of the first bridge pattern BR1 of the second conductive layer MSL2 may be disposed in the first semiconductor contact hole CNT-S1 to be connected to the source S1 of the first transistor T1, and a portion of the first bridge pattern BR1 at the other end opposite to the one end of the first bridge pattern BR1 may be disposed in the first light blocking contact hole CNT-B1 to be connected to the second light blocking pattern BML2. The connection pattern CNE of the fourth conductive layer MSL4 may be disposed on the third insulating layer 30. The connection pattern CNE may be disposed in the source contact hole CNT-O and the second light blocking contact hole CNT-B2 to be connected to the first bridge pattern BR1.

One end of the second bridge pattern BR2 of the second conductive layer MSL2 may be disposed in the second semiconductor contact hole CNT-S2 to be connected to the drain D2 of the second transistor T2, and the other end opposite to the one end of the second bridge pattern BR2 may be disposed in the data contact hole CNT-D to be connected to the second data line DL2.

FIGS. 6C and 7 illustrate, by hatching, a region in which the source S1 and the drain D1 of the first transistor T1 are reduced. From among the regions shown as the source S1 and the drain D1, a region overlapping with the additional power line ED-S1 illustrated in FIG. 6E may be provided as the drain D1, and a region overlapping with the first bridge pattern BR1 may be provided as the source S1. Accordingly, a region that is in contact with the third insulating layer 30 from among the source S1 and the drain D1 may be provided as a non-reduced region.

In FIG. 8, the display element layer DP-OLED is omitted for convenience of illustration. As illustrated in FIG. 8, In the present embodiment, the second power line EL may include a plurality of lines disposed at (e.g., in or on) different layers from each other.

The first line E-1 of the first conductive layer MSL1 may be disposed on the base layer BS. The first line E-1 may be disposed at (e.g., in or on) the same layer as that of the data lines DL1, DL2, and DL3. The first line E-1 may not overlap with the data lines DL1, DL2, and DL3.

The additional line E-2 of the third conductive layer MSL3 may be disposed on the second insulating layer 20. The additional line E-2 may be disposed at (e.g., in or on) the same layer as that of the gate G2 of the second transistor T2. The additional line E-2 may overlap with the first line E-1, and may not overlap with at least a portion of the data lines DL1, DL2, and DL3.

The second line E-3 of the fourth conductive layer MSL4 may be disposed on the third insulating layer 30. The second line E-3 may be disposed at (e.g., in or on) the same layer as that of the connection pattern CNE. The second line E-3 may have a larger area than those of the additional line E-2 and the first line E-1, and may overlap with the data lines DL1, DL2, and DL3. In addition, the second line E-3 may overlap with at least a portion of the second bridge pattern BR2.

According to one or more embodiments of the present disclosure, as the first bridge pattern BR1 connecting the first transistor T1 and the third transistor T3 to each other and the second bridge pattern BR2 connecting the second transistor T2 and the first data line DL1 to each other are disposed at (e.g., in or on) the same layer as that of the gates G1, G2, and G3 included in each of the first to third transistors T1, T2, and T3, a space in which the second line E-3 of the second power line EL is formed on the third insulating layer 30 may be sufficiently secured.

Therefore, from among the lines of the second power line EL, the area of the second line E-3, which is disposed at (e.g., in or on) the same layer as that of the connection pattern CNE, may be formed to be relatively larger than the areas of the first line E-1 and the additional line E-2.

Accordingly, the second line E-3 may also overlap with the second data line DL2 disposed farthest away from among the first to third data lines DL1, DL2, and DL3 in the first direction DR1 from the first line E-1 that is disposed at (e.g., in or on) the same layer as that of the first to third data lines DL1, DL2, and DL3.

According to one or more embodiments of the present disclosure, as the second line E-3 that is disposed in the uppermost layer from among the layers of the second power line EL is widely formed to overlap with the first to third data lines DL1, DL2, and DL3, the second power line EL having reduced resistance may be provided. In addition, when a bridge pattern connecting the first transistor T1 and the second transistor T2 to each other is formed on the second insulating layer 20, a parasitic capacitance, which is formed by the gate G1 of the first transistor T1 and protrudes from the second insulating layer 20, may be reduced. Accordingly, the display panel DP having improved reliability may be provided.

Figure 9:
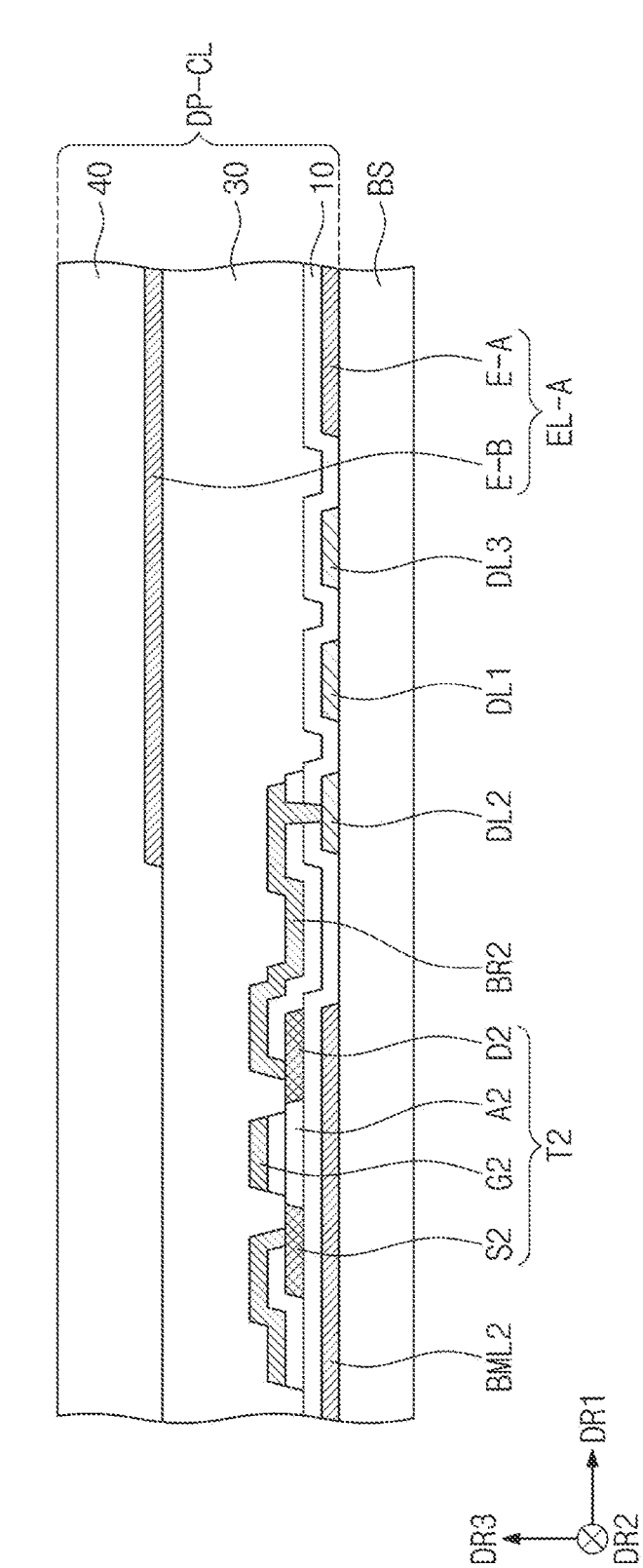
FIG. 9 is a cross-sectional view of a display panel according to an embodiment of the present disclosure.

FIG. 9 is a cross-sectional view of a display panel according to an embodiment of the present disclosure. In FIG. 9, the same or similar reference numerals are used to denote the same or substantially the same (or similar) components as those described above with reference to FIGS. 5 to 7, and thus, redundant description thereof may not be repeated.

Referring to FIG. 9, a second power line EL-A of the display panel DP-A according to an embodiment of the present disclosure may include a first line E-A and a second line E-B. Unlike the second power line EL described above with reference to FIG. 8, the additional line E-2 disposed on the second insulating layer 20 may be omitted. The second line E-B may overlap with the first to third data lines DL1, DL2, and DL3.

Figure 10:
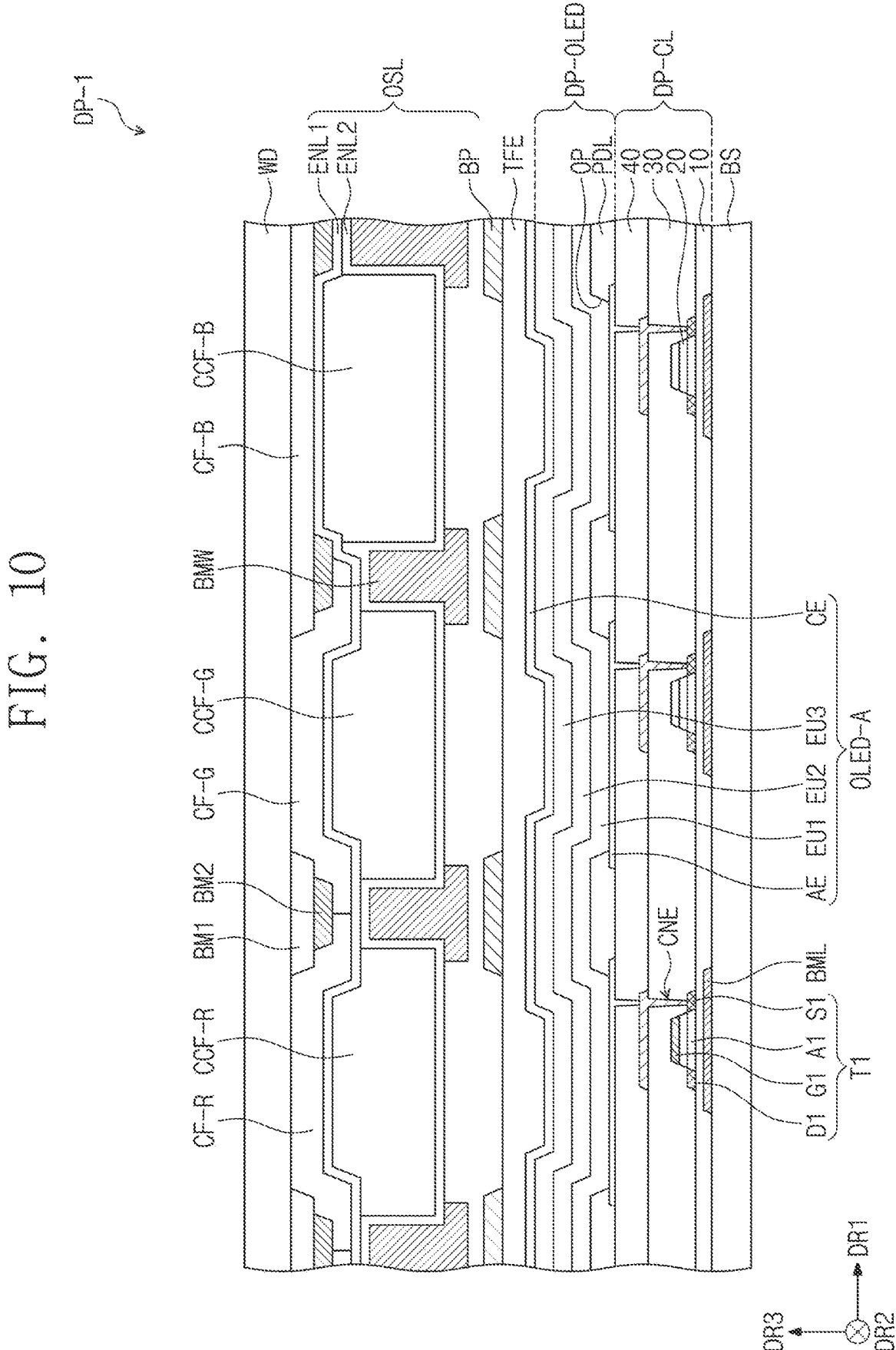
FIG. 10 is a cross-sectional view of a display panel according to an embodiment of the present disclosure.
Figure 11:
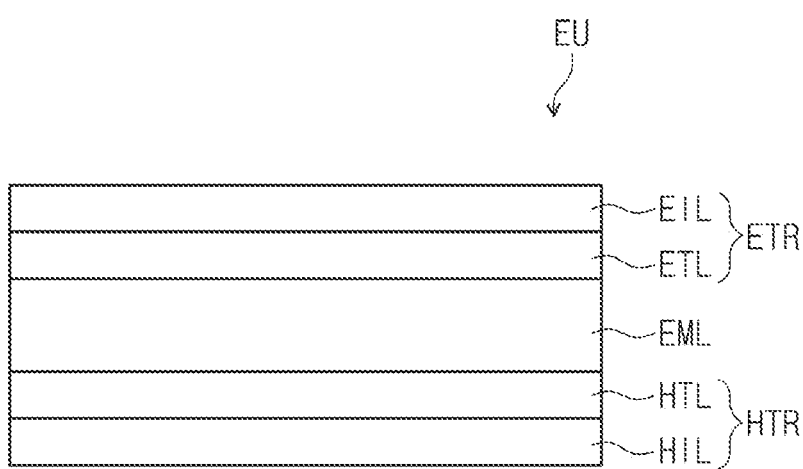
FIG. 11 is a cross-sectional view of a light-emitting unit according to an embodiment of the present disclosure.

FIG. 10 is a cross-sectional view of a display panel according to an embodiment of the present disclosure. FIG. 11 is a cross-sectional view of a light-emitting unit according to an embodiment of the present disclosure.

Referring to FIG. 10, the display panel DP-1 according to an embodiment of the present disclosure includes a base layer BS, a circuit element layer DP-CL disposed on the base layer BS, a display element layer DP-OLED, a thin film encapsulation layer TFE, a light control layer OSL, and a window panel WD.

The configuration of the base layer BS and the circuit element layer DP-CL included in the display panel DP-1 may correspond to the base layer BS and the circuit element layer DP-CL included in the display panel DP described above. In other words, the configuration of the insulating layers 10 to 40 and the conductive layers MSL1 to MSL4 described above with reference to FIGS. 6A to 6G may be applied to the base layer BS and the circuit element layer DP-CL of the display panel DP-1 according to the present embodiment in the same or substantially the same manner, and thus, redundant description thereof may not be repeated.

The circuit element layer DP-CL including the transistors may be disposed on the base layer BS. For convenience, FIG. 10 illustrates a cross-sectional view including only the first transistor T1 from among the first to third transistors T1, T2, and T3 described above with reference to FIG. 4.

The display element layer DP-OLED may include a light-emitting element OLED-A connected to one of the first to third transistors T1, T2, and T3.

In the present embodiment, the light-emitting element OLED-A includes a first electrode AE, a plurality of light-emitting units (e.g., a plurality of light-emitting structures) EU1, EU2, and EU3, and a second electrode CE. According to an embodiment of the present disclosure, the light-emitting element OLED-A may include charge generation layers that are disposed between first and second light-emitting units (e.g., first and second light-emitting structures) EU1 and EU2, and between the second and third light-emitting units (e.g., second and third light-emitting structures) EU2 and EU3. The light emitting units EU1, EU2, and EU3 according to an embodiment of the present disclosure may emit light of the same or substantially the same color as each other or different colors from each other, but the present disclosure is not limited to any particular embodiment.

Referring to FIG. 11, each of the light-emitting units EU1, EU2, and EU3 illustrated in FIG. 10 may have the same or substantially the same stacked structure as that of the light-emitting unit EU illustrated in FIG. 11.

The light-emitting unit EU according to an embodiment of the present disclosure may include a hole control layer HTR, an electron control layer ETR, and a light-emitting layer EML disposed between the hole control layer HTR and the electron control layer ETR.

The hole control layer HTR according to an embodiment of the present disclosure may include at least one of a hole injection layer HIL or a hole transport layer HTL. The hole transport layer HTL may include at least one of a hole buffer layer or an electron blocking layer.

The hole control layer HTR may have a single-layer structure including (e.g., composed of) a single material, a single-layer structure including (e.g., composed of) a plurality of different materials, or a multi-layered structure having a plurality of layers including (e.g., composed of) a plurality of different materials. For example, as illustrated in FIG. 11, the hole control layer HTR may have a structure in which the hole injection layer HIL and the hole transport layer HTL are sequentially stacked.

However, present disclosure is not limited thereto, and the hole control layer HTR may be formed of various suitable stacked structures, such as a hole injection layer/a hole transport layer/a hole buffer layer, a hole injection layer/a hole buffer layer, a hole transport layer/a hole buffer layer, or a hole injection layer/a hole transport layer/an electron blocking layer, which are sequentially stacked.

The hole control layer HTR and the electron control layer ETR may be formed by using any suitable method known to those having ordinary skill in the art. For example, the hole control layer HTR may be formed by using various suitable methods, such as a vacuum deposition method, a spin coating method, a casting method, a Langmuir-Blodgett (LB) method, an inkjet printing method, a laser printing method, and/or a laser induced thermal imaging (LITI) method.

The light-emitting layer EML according to an embodiment of the present disclosure may include (e.g., may contain) a host material and a dopant material. The light-emitting layer EML may be formed by using a phosphorescent or fluorescent light-emitting material as a dopant for the host material. The host material is not particularly limited thereto, as long as the host material is a generally used material. The color of light emitted from the light-emitting layer EML may be determined by a combination of a host material and a dopant material. The light-emitting layer EML may provide any one of red, blue, and green light. Accordingly, the light-emitting layer EML included in each of the light emitting units EU1, EU2, and EU3 may provide light of a different color from the others.

The light-emitting layer EML according to an embodiment of the present disclosure may be formed by using various suitable methods, such as a vacuum deposition method, a spin coating method, a casting method, a Langmuir-Blodgett (LB) method, an inkjet printing method, a laser printing method, and/or a laser induced thermal imaging (LITI) method.

According to an embodiment of the present disclosure, a first charge generation layer may be disposed between the first light-emitting unit EU1 and the second light-emitting unit EU2, and a second charge generation layer may be disposed between the second light-emitting unit EU2 and the third light-emitting unit EU3. When a voltage is applied to the charge generation layers, the charge generation layers may generate charges (e.g., electrons and holes) by forming a complex compound through an oxidation-reduction reaction. In addition, the charge generation layers may provide the generated charges to each of the light-emitting units EU1 and EU2. The charge generation layers may double the efficiency of current generated in one light-emitting unit EU, and may serve to adjust a balance of charges between the first light-emitting unit EU1 and the second light-emitting unit EU2.

The first charge generation layer may be disposed at a relatively lower position than the second charge generation layer, and may be an n-type charge generation layer configured to provide electrons to the first light-emitting unit EU1. The second charge generation layer may be disposed at a relatively upper position than the first charge generation layer, and may be a p-type charge generation layer configured to provide holes to the second light-emitting unit EU2.

Although FIG. 10 illustrates three light-emitting units EU1, EU2, and EU3, present disclosure is not limited thereto. In other embodiments, the light-emitting element OLED-A may include two, four, or more light-emitting units (e.g., light-emitting structures), and charge generation layers disposed between adjacent ones of the light-emitting units, but the present disclosure is not limited to any particular embodiment.

The thin film encapsulation layer TFE may cover the third light-emitting unit EU3. The thin film encapsulation layer TFE may include a plurality of inorganic layers, and at least one organic layer. In an embodiment of the present disclosure, the thin film encapsulation layer TFE may include a stacked structure including a material corresponding to one or more of those of the thin film encapsulation layer TFE described above with reference to FIG. 2, but the present disclosure is not limited to any particular embodiment.

The light control layer OSL may be formed on the window panel WD to be connected to (e.g., coupled to or attached to) the base layer BS through a separately provided adhesive member. A stacking order of components included in the light control layer OSL will be described in more detail in an order in which the components are formed on the window panel WD, which serves as a base layer.

The light control layer OSL may include partition patterns BM1 and BM2, color filters CF-R, CF-G, and CF-B, color control layers CCF-R, CCF-G, and CCF-B, a partition barrier rib BMW, and a plurality of capping layers ENL1 and ENL2. The light control layer OSL according to an embodiment of the present disclosure may further include an additional partition pattern disposed on the thin film encapsulation layer TFE.

A first partition pattern BM1 may be disposed on the window panel WD. The first partition pattern BM1 may overlap with the pixel defining film PDL.

The first partition pattern BM1 may define a first opening in which the color filters CF-R, CF-G, and CF-B are disposed. In this case, the opening may be defined differently according to optical properties of the first partition pattern BM1.

For example, the first partition pattern BM1 may include (e.g., may contain) the same or substantially the same material as that of a third color filter CF-B. In this case, openings in which a first color filter CF-R and a second color filter CF-G are disposed may be defined by the first partition pattern BM1, and an opening in which the third color filter CF-B is disposed may be omitted. Accordingly, the first partition pattern BM1 and the third color filter CF-B may be concurrently (e.g., may be simultaneously) formed with each other.

According to the present embodiment, as the first partition pattern BM1 and the third color filter CF-B are formed in an integral shape, a reflectance caused by external light at an interface between the window panel WD and the third color filter CF-B may be reduced. Accordingly, the display panel DP-1 having improved visibility may be provided.

A second partition pattern BM2 may be disposed on the first partition pattern BM1. A second opening is defined in the second partition pattern BM2. The second opening may overlap with the first opening defined in the first partition pattern BM1. An area of the second opening may be larger than an area of the first opening. The second partition pattern BM2 may include (e.g., may be) a black matrix that blocks or substantially blocks (e.g., that blocks most of) an entire wavelength band of visible light.

According to one or more embodiments of the present disclosure, as the display panel DP-1 includes the partition patterns BM1 and BM2 disposed on the window panel WD, mixing of different light colors controlled by each of the color control layers CCF-R, CCF-G, and CCF-B may be prevented or reduced. Accordingly, the display panel DP-1 having improved color reproducibility may be provided.

The first to third color filters CF-R, CF-G, and CF-B are disposed on the window panel WD. The first to third color filters CF-R, CF-G, and CF-B include pigments and/or dyes for absorbing different wavelength bands of light from each other. The first color filter CF-R may be a red color filter, the second color filter CF-G may be a green color filter, and the third color filter CF-B may be a blue color filter.

The first color filter CF-R and the second color filter CF-G may be disposed in corresponding openings from among the openings of the first and second partition patterns BM1 and BM2. A first capping layer ENL1 is disposed on the first to third color filters CF-R, CF-G, and CF-B to cover the first to third color filters CF-R, CF-G, and CF-B. The first capping layer ENL1 may be commonly disposed on the first to third color filters CF-R, CF-G, and CF-B.

The first capping layer ENL1 may include (e.g., may contain) an inorganic material. For example, the first capping layer ENL1 may include any one of silicon oxide, silicon nitride, or silicon oxynitride.

The first to third color control layers CCF-R, CCF-G, and CCF-B may be disposed on the first capping layer ENL1. After absorbing source light generated by the light-emitting element OLED-A, at least one of the first to third color control layers CCF-R, CCF-G, and CCF-B may generate light having a color different from that of the source light. In addition, one of the first to third color control layers CCF-R, CCF-G, and CCF-B may transmit incident source light.

For example, the first color control layer CCF-R may absorb blue light and generate red light, and the second color control layer CCF-G may absorb blue light and generate green light. In other words, the first color control layer CCF-R and the second color control layer CCF-G may include different quantum dots from each other. The third color control layer CCF-B may transmit blue light.

The first and second color control layers CCF-R and CCF-G may include a base resin, and quantum dots mixed (or dispersed) in the base resin. In the present embodiment, the first and second color control layers CCF-R and CCF-G may be defined as quantum dot layers. The third color control layer CCF-B according to the present embodiment may include scattering particles (e.g., scatterers). The scattering particles may include (e.g., may be) titanium oxide (TiO2)-based nanoparticles or silica-based nanoparticles.

A second capping layer ENL2 may individually seal the first to third color control layers CCF-R, CCF-G, and CCF-B. For example, in a region overlapping with the second partition pattern BM2, the first capping layer ENL1 and the second capping layer ENL2 may come in contact with each other to seal each of the first to third color control layers CCF-R, CCF-G, and CCF-B.

The second capping layer ENL2 may include (e.g., may contain) an inorganic material. For example, the second capping layer ENL2 may include any one of silicon oxide, silicon nitride, or silicon oxynitride.

The partition barrier rib BMW may be disposed on the second capping layer ENL2. The partition barrier rib BMW may be disposed on a portion of the second capping layer ENL2 overlapping with the second partition pattern BM2 from among the second capping layer ENL2. A portion of the partition barrier rib BMW may be covered by the second capping layer ENL2. The partition barrier rib BMW may include (e.g., may contain) a suitable material that absorbs light.

The light control layer OLS according to the present embodiment may further include an additional partition pattern BP. The additional partition pattern BP may be disposed on the thin film encapsulation layer TFE. The additional partition pattern BP may overlap with the partition barrier rib BMW. However, present disclosure is not limited thereto, and the additional partition pattern BP may be omitted as needed or desired.

Figure 12:
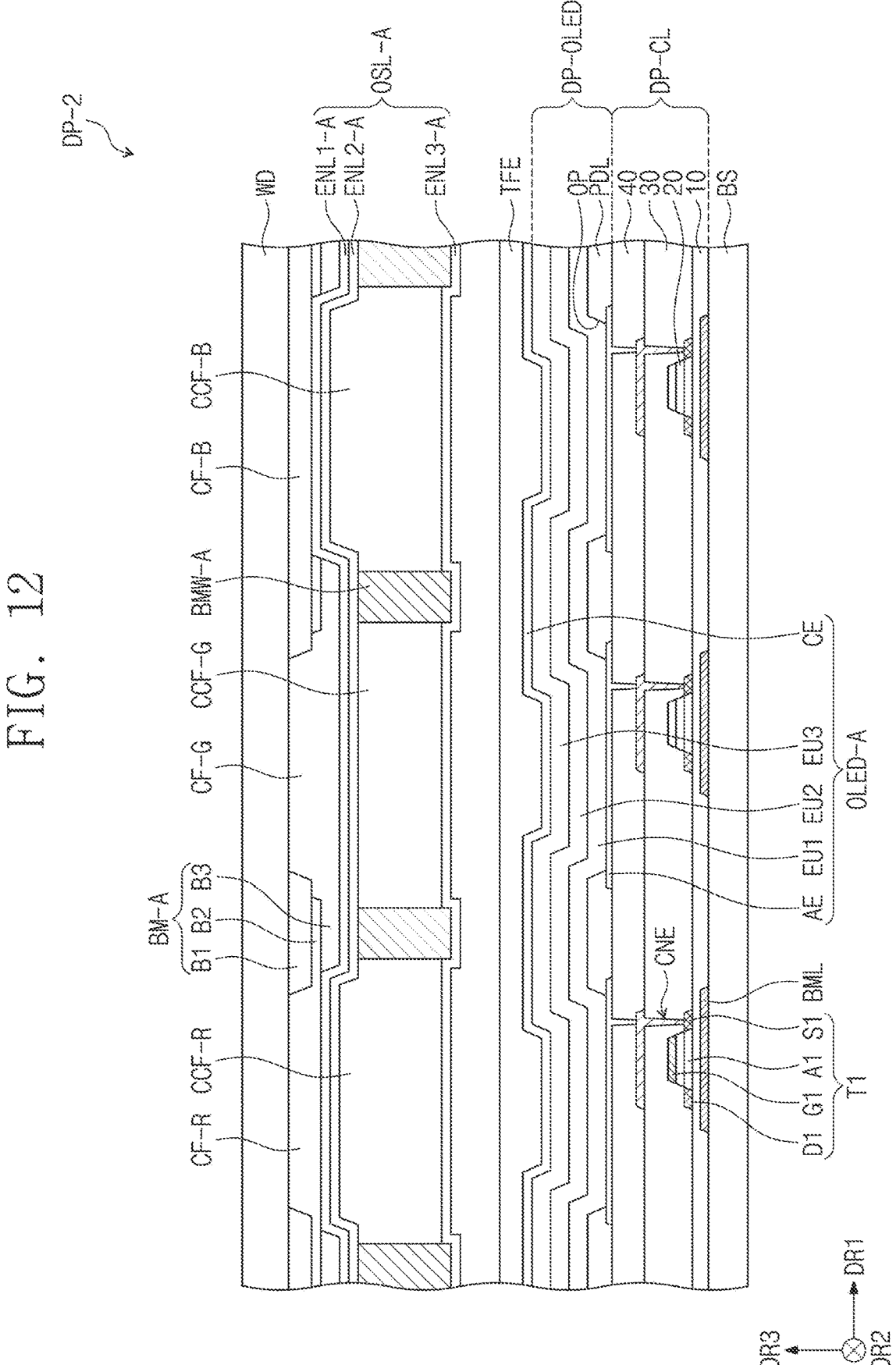
FIG. 12 is a cross-sectional view of a display panel according to an embodiment of the present disclosure.

FIG. 12 is a cross-sectional view of a display panel according to an embodiment of the present disclosure. In FIG. 12, the same or similar reference numerals are used to designate the same or substantially the same (or similar) components as those described above with reference to FIGS. 1 to 11, and thus, redundant description thereof may not be repeated.

Referring to FIG. 12, the display panel DP-2 according to an embodiment of the present disclosure includes a base layer BS, a circuit element layer DP-CL disposed on the base layer BS, a display element layer DP-OLED, a thin film encapsulation layer TFE, a light control layer OSL-A, and a window panel WD.

The base layer BS, the circuit element layer DP-CL, the display element layer DP-OLED, the thin film encapsulation layer TFE, and the window panel WD of the display panel DP-2 may correspond to the base layer BS, the circuit element layer DP-CL, the display element layer DP-OLED, the thin film encapsulation layer TFE, and the window panel WD of the display panel DP-1 described above with reference to FIG. 11, and thus, redundant description thereof may not be repeated.

In addition, from among the components included in the light control layer OSL-A, the color filters CF-R, CF-G, and CF-B and the first to third color control layers CCF-R, CCF-G, and CCF-B may correspond to the color filters CF-R, CF-G, and CF-B and the first to third color control layers CCF-R, CCF-G, and CCF-B described above with reference to FIG. 10. Therefore, differences between the embodiment shown in FIG. 12 with those of one or more embodiments described above may be mainly described hereinafter, and redundant description may not be repeated.

The light control layer OSL-A may include a partition pattern BM-A, color filters CF-R, CF-G, and CF-B, color control layers CCF-R, CCF-G, and CCF-B, a partition barrier rib BMW-A, and a plurality of capping layers ENL1-A, ENL2-A, and ENL3-A.

The partition pattern BM-A according to an embodiment of the present disclosure may have a structure in which portions of the color filters CF-R, CF-G, and CF-B that overlap with the pixel defining layer PDL are stacked. The partition pattern BM-A may include a first pattern B1, a second pattern B2, and a third pattern B3.

The first pattern B1 may be disposed on the window panel WD, and may include (e.g., may contain) the same material as that of the third color filter CF-B. The first pattern B1 overlapping with the pixel defining layer PDL in a region in which the third color filter CF-B is disposed may be provided integrally with the third color filter CF-B.

The first pattern B1 disposed between the first and second color filters CF-R and CF-G may be patterned and disposed on the window panel WD.

The second pattern B2 may be disposed on the first pattern B1. The second pattern B2 may include (e.g., may contain) the same material as that of the first color filter CF-R. The second pattern B2 overlapping with the pixel defining layer PDL in a region in which the first color filter CF-R is disposed may be provided integrally with the first color filter CF-R.

The second pattern B2 disposed between the second and third color filters CF-G and CF-B may be patterned and disposed on the first pattern B1.

The third pattern B3 may be disposed on the second pattern B2. The third pattern B3 may include (e.g., may contain) the same material as that of the second color filter CF-G. The third pattern B3 overlapping with the pixel defining layer PDL in a region in which the second color filter CF-G is disposed may be provided integrally with the second color filter CF-G.

The third pattern B3 disposed between the first and third color filters CF-R and CF-B may be patterned and disposed on the second pattern B2.

According to the present embodiment, as the partition pattern BM-A is formed by stacking a portion of each of the color filters CF-B, CF-G, and CF-R without using a process of forming the partition pattern through application of a separate light blocking material, a process cost and time for forming the light control layer OSL-A may be reduced or minimized (e.g., may be saved).

A first capping layer ENL1-A may cover the color filters CF-B, CF-G, and CF-R and the partition pattern BM-A. The first capping layer ENL1-A may include (e.g., may contain) an inorganic material. For example, the first capping layer ENL1-A may include any one of silicon oxide, silicon nitride, or silicon oxy nitride. In the present embodiment, the first capping layer ENL1-A may be defined as a low refractive index layer.

The second capping layer ENL2-A may be disposed on the first capping layer ENL1-A. According to an embodiment of the present disclosure, the first capping layer ENL1-A may have a relatively lower refractive index than that of the second capping layer ENL2-A.

According to an embodiment of the present disclosure, the first capping layer ENL1-A may be omitted as needed or desired, and the color filters CF-B, CF-G, and CF-R may be covered by the second capping layer ENL2-A. However, the present disclosure is not limited to any particular embodiment.

The partition barrier rib BMW-A may be disposed on the second capping layer ENL2-A. The partition barrier rib BMW-A may be disposed on a portion of the second capping layer ENL2-A overlapping with the partition pattern BM-A from among the second capping layer ENL2-A.

Unlike the partition barrier rib BMW shown in FIG. 10, the partition barrier rib BMW-A according to an embodiment of the present disclosure may come in contact with adjacent ones of the first to third color control layers CCF-R, CCF-G, and CCF-B. In addition, the partition barrier rib BMW-A may be covered by the second capping layer ENL2-A and the third capping layer ENL3-A.

The display panel DP-2 according to an embodiment of the present disclosure may further include an additional partition pattern BP described above with reference to FIG. 10. The additional partition pattern BP may be disposed on the thin film encapsulation layer TFE. The additional partition pattern BP may overlap with the partition barrier rib BMW-A.

The third capping layer ENL3-A may cover the first to third color control layers CCF-R, CCF-G, and CCF-B and a portion of the partition barrier rib BMW-A exposed among the first to third color control layers CCF-R, CCF-G, and CCF-B. The third capping layer ENL3-A may include (e.g., may contain) an inorganic material.

The first to third capping layers ENL1-A, ENL2-A, and ENL3-A of the display panel DP-2 according to an embodiment of the present disclosure may be provided as low refractive index layers. At least one of the first to third capping layers ENL1-A, ENL2-A, and ENL3-A may be omitted as needed or desired.

For example, the second and third capping layers ENL2-A and ENL3-A may be omitted as needed or desired, so that the first to third color control layers CCF-R, CCF-G, and CCF-B come in contact with the first capping layer ENL1-A. In another example, the first and second capping layers ENL1-A and ENL2-A may be omitted as needed or desired, so that the first to third color control layers CCF-R, CCF-G, and CCF-B come in contact with the corresponding color filters CF-B, CF-G, and CF-R and the third capping layer ENL3-A. As another example, the first capping layer ENL1-A may be omitted as needed or desired, so that the first to third color control layers CCF-R, CCF-G, and CCF-B come in contact with the second and third capping layers ENL2-A and ENL3-A. However, the present disclosure is not limited to any particular embodiment.

According to one or more embodiments of the present disclosure, a power line having reduced resistance may be provided by widely forming a line disposed in the uppermost layer from among the layers of the power line, so that the line overlaps with the data lines.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display panel comprising:

a base layer;

a plurality of insulating layers on the base layer; and a first pixel connected to a reference line, a scan line, a sensing line, a first power line, a first data line, and a second power line, wherein:

the reference line is configured to provide an initialization voltage;

at least a portion of the scan line and at least a portion of the sensing line each extend in a first direction, and are spaced from each other in a second direction crossing the first direction;

the first power line is configured to provide a first voltage;

the first data line extends in the second direction; and the second power line extends in the second direction, and is configured to provide a second voltage lower than the first voltage, and wherein:

the first pixel comprises a first transistor, a second transistor, a third transistor, a light-emitting element, and a capacitor;

the light-emitting element comprises a first electrode connected to at least one of the first, second, or third transistors, a second electrode, and a light-emitting layer between the first electrode and the second electrode;

the second power line comprises a first line and a second line on the first line and overlapping with the first line, and an additional line extending in the second direction and located between the first line and the second line, the first line being located on an insulating layer on which the first data line is located, and the second line being located on an insulating layer different from the insulating layer on which the first line is located;

the first line is spaced from the first data line;

the second line overlaps with the first data line in a plan view from above the first data line; and end portions of the additional line that are spaced apart from each other in the second direction overlap with the first data line, and a remaining portion of the additional line is spaced from the first data line in the first direction.

2. The display panel of claim 1, wherein an area of the second line is larger than an area of the first line.

3. The display panel of claim 1, further comprising:

a second data line spaced from the first data line in the first direction, and extending in the second direction; and a second pixel spaced from the first pixel, and connected to the reference line, the scan line, the sensing line, the second data line, the first power line, and the second power line, wherein the second data line overlaps with the second line, and is spaced from the first line in the first direction with the first data line interposed therebetween.

4. The display panel of claim 3, further comprising:

a third data line spaced from the second data line in the first direction with the first data line interposed therebetween, and extending in the second direction; and a third pixel spaced from the second pixel, and connected to the reference line, the scan line, the sensing line, the third data line, the first power line, and the second power line, wherein the third data line overlaps with the second line, and is located between the first data line and the first line.

5. The display panel of claim 1, wherein:

the first transistor comprises a drain connected to the first electrode, a source, a channel region, and a gate;

the second transistor comprises a source connected to the gate of the first transistor, a drain connected to the first data line, a channel region, and a gate connected to the scan line; and the third transistor comprises a drain connected to the second electrode, a source connected to the reference line, a channel region, and a gate connected to the sensing line.

6. The display panel of claim 5, wherein:

the insulating layers comprise:

a first insulating layer on the base layer to cover a first conductive layer;

a second insulating layer on the first insulating layer to cover a second conductive layer;

a third insulating layer on the second insulating layer to cover a third conductive layer; and a fourth insulating layer on the third insulating layer to cover a fourth conductive layer; and the first conductive layer comprises the reference line, the first power line, the first data line, the first line, and a light blocking pattern located below the first transistor.

7. The display panel of claim 6, wherein the second conductive layer comprises the source, the drain, and the channel region of each of the first, second, and third transistors.

8. The display panel of claim 7, wherein:

first power contact holes and a first line contact hole exposing a portion of the first power line are defined in the first insulating layer;

first additional contact holes exposing a portion of the first line, first reference contact holes exposing a portion of the reference line, and a data contact hole exposing a portion of the first data line are defined in the first insulating layer;

semiconductor contact holes exposing a portion of the source and a portion of the drain of each of the first to third transistors are defined in the second insulating layer; and a first light blocking contact hole exposing a portion of the light blocking pattern adjacent to the source of the first transistor is defined in the first insulating layer and the second insulating layer.

9. The display panel of claim 8, wherein the third conductive layer comprises:

a portion of each of the scan line, the sensing line, and the capacitor;

a first additional reference line overlapping with the reference line, and connected to the source of the third transistor;

a first bridge pattern connecting the drain of the third transistor and the source of the first transistor to each other;

the gate of the first transistor;

a first additional power line overlapping with a portion of the first power line, and connected to the drain of the first transistor; and a second bridge pattern connecting the source of the second transistor and the first data line to each other.

10. The display panel of claim 9, wherein:

the additional line is included in the third conductive layer.

11. The display panel of claim 10, wherein:

second reference contact holes exposing a portion of the first additional reference line are defined in the third insulating layer;

scan contact holes exposing a portion of the scan line and the sensing line are defined in the third insulating layer;

a source contact hole overlapping with the source of the first transistor and exposing the first bridge pattern is defined in the third insulating layer;

second power contact holes overlapping with the first additional power line, a second line contact hole overlapping with the first line contact hole, and a second light blocking contact hole overlapping with the first light blocking contact hole are defined in the third insulating layer; and second additional contact holes exposing a portion of the additional line are defined in the third insulating layer.

12. The display panel of claim 11, wherein the second insulating layer is covered by the third conductive layer.

13. The display panel of claim 11, wherein the fourth conductive layer is on the third insulating layer, and comprises:

a remaining portion of each of the scan line, the sensing line, and the capacitor;

a second additional reference line overlapping with the first additional reference line;

a second additional power line overlapping with a portion of the first additional power line;

a connection pattern overlapping with the light blocking pattern, and connecting the first bridge pattern and the first electrode to each other; and the second line.

14. The display panel of claim 9, wherein:

a connection contact hole is defined in the fourth insulating layer; and the first electrode is connected to the first bridge pattern through the connection contact hole to be connected to the first transistor.

15. A display panel comprising:

a scan line partially extending in a first direction;

a data line extending in a second direction crossing the first direction;

a light-emitting element comprising a first electrode, a second electrode on the first electrode, and at least one light-emitting layer between the first electrode and the second electrode;

a first transistor connected to the first electrode;

a second transistor connected to the data line;

a first power line configured to provide a first voltage to the first transistor; and a second power line configured to provide a second voltage lower than the first voltage to the second electrode, wherein:

the second power line comprises a first line located at the same layer as that of the data line, a second line located at a different layer from that of the first line, and an additional line extending in the second direction and located between the first line and the second line;

an area of the second line is larger than an area of the first line;

the second line overlaps with the first line and the data line in a plan view from above the first line and the data line; and end portions of the additional line that are spaced from each other in the second direction overlap with the data line, and a remaining portion of the additional line is spaced from the data line in the first direction.

16. The display panel of claim 15, wherein:

the first transistor comprises a source connected to the light-emitting element, a drain connected to the first power line, a channel region, and a gate;

the second transistor comprises a source connected to the first transistor, a drain connected to the data line, a channel region, and a gate connected to the scan line; and the display panel further comprises a bridge pattern connecting the source of the second transistor and the data line to each other, the bridge pattern being located at the same layer as that of the gates of the first and second transistors.

17. The display panel of claim 16, wherein at least a portion of the bridge pattern overlaps with the second line.

18. The display panel of claim 15, wherein:

the light-emitting element comprises:

a plurality of light-emitting units; and charge generation layers located between the light-emitting units; and each of the light-emitting units comprises the light-emitting layer, a hole control layer between the first electrode and the light-emitting layer, and a charge control layer between the light-emitting layer and the second electrode.

* * * * *